(12) United States Patent
LaMarche

(10) Patent No.: US 7,304,597 B1
(45) Date of Patent: Dec. 4, 2007

(54) ADAPTIVE INTERPOLATION FOR USE IN REDUCING SIGNAL SPURS

(75) Inventor: Francois LaMarche, New Milford, NJ (US)

(73) Assignee: Lecroy Corporation, Chestnut Ridge, NY (US)

( * ) Notice: Subject to any disclaimer, the term of this patent is extended or adjusted under 35 U.S.C. 154(b) by 0 days.

(21) Appl. No.: 11/442,030

(22) Filed: May 26, 2006

(51) Int. Cl.
*H03M 1/12* (2006.01)

(52) U.S. Cl. ............... 341/155; 341/118; 341/120; 341/143; 708/300; 375/350

(58) Field of Classification Search ............... None
See application file for complete search history.

(56) References Cited

U.S. PATENT DOCUMENTS

| | | | |
|---|---|---|---|
| 3,783,413 A | 1/1974 | Froment et al. | |
| 3,891,803 A | 6/1975 | Daguet et al. | |
| 3,903,484 A | 9/1975 | Testani | |
| 4,316,282 A | 2/1982 | Macina | |
| 5,568,142 A * | 10/1996 | Velazquez et al. | 341/126 |
| 5,659,546 A | 8/1997 | Elder | |
| 5,668,836 A | 9/1997 | Smith et al. | |
| 5,732,189 A * | 3/1998 | Johnston et al. | 704/230 |
| 5,950,119 A | 9/1999 | McGeehan et al. | |
| 6,240,150 B1 | 5/2001 | Darveau et al. | |
| 6,252,535 B1 * | 6/2001 | Kober et al. | 341/155 |
| 6,339,390 B1 * | 1/2002 | Velazquez et al. | 341/120 |
| 6,340,883 B1 | 1/2002 | Nara et al. | |
| 6,380,879 B2 | 4/2002 | Kober et al. | |
| 6,388,594 B1 * | 5/2002 | Velazquez et al. | 341/120 |
| 6,466,957 B1 * | 10/2002 | Messerly et al. | 708/300 |
| 6,628,781 B1 * | 9/2003 | Grundstrom et al. | 379/406.14 |
| 6,865,587 B2 * | 3/2005 | Kovacevic et al | 708/313 |
| 6,940,896 B2 * | 9/2005 | Mandell et al. | 375/150 |
| 2002/0150173 A1 | 10/2002 | Buda | |
| 2004/0041599 A1 | 3/2004 | Murphy et al. | |
| 2004/0190660 A1 * | 9/2004 | Morris et al. | 375/350 |
| 2004/0252044 A1 | 12/2004 | Mathis et al. | |

(Continued)

FOREIGN PATENT DOCUMENTS

EP 0275136 7/1988

(Continued)

OTHER PUBLICATIONS

"A matter of time: Today's RF signals call for a different kind of spectrum analysis", *Tektronix, Inc.* (2000), 1-8.

(Continued)

*Primary Examiner*—Khai M. Nguyen
(74) *Attorney, Agent, or Firm*—Gordon Kessler

(57) ABSTRACT

A method and apparatus for acquiring an analog signal. The method of the invention comprising the steps of acquiring a first portion of the analog signal by a first channel, the first portion of the analog signal spanning a first bandwidth range, and acquiring a second portion of the analog signal by a second channel, the second portion of the analog signal spanning a second bandwidth range adjacent the first bandwidth range. At least one spur in the signal acquired by the first channel corresponding to a portion of the analog signal that should have properly been acquired by the second channel is offset with an opposite spur in the second channel.

28 Claims, 18 Drawing Sheets

U.S. PATENT DOCUMENTS

| | | | | |
|---|---|---|---|---|
| 2006/0087461 | A1* | 4/2006 | Danzig et al. | 341/118 |
| 2006/0247870 | A1* | 11/2006 | Pickerd | 702/57 |
| 2006/0267811 | A1* | 11/2006 | Tan | 341/51 |

FOREIGN PATENT DOCUMENTS

| | | |
|---|---|---|
| EP | 0589594 | 3/1994 |

OTHER PUBLICATIONS

"Advanced transmission library: Optional block function library for hypersignal block diagram/ride", *Hyperception, Inc.* (1997), 1-2.

"Agilent E5052A signal source analyzer 10MHz to 7GHz", *Agilent Technologies*, (Jun. 9, 2004), 1, 6, 7.

"Digital Signal Processing Applications Using the ADSP-2100 Family", *Prentice Hall,* (1990), 458-461.

"Electronics engineers' handbook", (1975), —16 pages.

"Genesys, 2004 RF Microwave Design Software—Simulation", *Eagleware Corporation,* (2004), 108-110.

"Japanese abstract of JP 06 197019", *Hitachi Denshi., LTd,* (Jul. 15, 1994).

"Putting undersampling to work", *Pentek, Inc.* 1-2, no date.

"R3681 Signal analyzer", *Advantest,* (2004), 1-2.

"Real-time spectrum analysis tools aid transition to third-generation wireless technology", *Tektronix, Inc.* (1999), 1-6.

"Sampling and reconstruction of periodic signals", *DSP-FPGA. COM,* 1-15, no date.

"Signature—high performance signal analyzer 100Hz to 8GHz", *Anritsu,* (2000), 1-2.

Adam, Stephen F., "Microwave Theory and Applications", *Prentice Hall,* (1969),490-500.

Apolinario, Jr, J.A. , et al., "On perfect resonstruction in critically sampled frequency-domain scrambler", 1-4, no date.

Crochiere, Ronald E., et al., "Interpolation and Decimation of Digital Signals—A Tutorial Review", *Proceedings of the IEEE*, vol. 69, No. 3, (Mar. 1981),300-331.

Ding, G , et al., "Frequency-interleaving technique for high-speed A/D conversion", *IEEE,* (2003),1857-1860.

Hoyos, Sebastian , et al., "Analog to digital conversion of ultra-wideband signals in orthogonal spaces", *IEEE,* (2003),47-51.

Johannson, Hakan , et al., "Reconstruction of Nonuniformly sampled bandlimited signals by means of digital fractional delay filters", IEEE Transactions on signal processing vol. 50 No. 11,(Nov. 2002),2757-2767.

Jong, "Methods of Discrete Signal and Systems Analysis", *McGraw-Hill,* (1982),369-373.

Lee, Hyung-Jin , et al., "Frequency domain approach for CMOS ultra-wideband radios", *Proceedings for the IEEE computer society annual symposium on VLSI,* (2003),1-2.

Luo, Xiliang , et al., "Real-time speech frequency scrambling and descrambling", 1-17, no date.

Lyons, Richard G., "Understanding digital signal processing", *Prentice Hall professional technical reference, second edition,* (2004),30-39, 346-360, 471-479, 571-572.

Paquelet, Stephanie , et al., "RF front-end considerations for SDR Ultra-wideband communications systems", *RF Design,* (Jul. 2004),44-51.

Pupalaikis, Peter J., "Bilinear Transformation Made Easy", *ICSPAT 2000 Proceedings, CMP Publications,* (2000), 1-5.

Ramachandran, Ravi P., et al., "Transmultipliers: Perfect Reconstruction and Compensation of Channel Distortion", *Elsevier Science Publishers B.V.,* Signal Processing 21,(1990),261-274.

Schniter, Phil , "Aliasing-Cancellation Conditions of Filterbanks", Version 2.10 http://cnx.org/content/m10425/latest/. (Sep. 16, 2005),1-2.

Schniter, Phil , "Two-Branch Alias (Cancelling Filterbanks)", Version 2.9 http://cnx.rice.edu/content/m10425/latest/, (Jan. 13, 2003),1-2.

Smith, Julius O., "MUS420/EE367A Lecture 4A, Interpolated Delay Lines, Ideal Bandlimited Interpolation, and Fractional Delay Filter Design", *Stanford University,* 1-50, no date.

Velazquez, Scott R., et al., "Design of hybrid filter banks for analog/digital conversion", *IEEE transactions on signal processing* vol. 46, No. 4, (Apr. 04, 1998),956-967.

Velazquez, Scott R., "High-performance advanced filter bank analog-to-digital converter for universal RF receivers", *V Company, IEEE,* (1998),229-232.

Welaratna, Ruwan , "Effects of Sampling and Aliasing on the Conversion of Analog Signals to Digital Format", *Data Physics Corporation Sound and Vibration,* (Dec. 2002),12-13.

* cited by examiner

Aliasing cancellation condition of filterbanks: $-H_1(z)/G_0(-z) = H_0(z)/G_1(-z)$ letting $IPH(z) = H_1(-z) = G_0(z)z$
$IPL(z) = H_0(z)/z = -G_1(-z)$     condition met

ADAPTIVE INTERPOLATION FOR USE IN REDUCING SIGNAL SPURS

BACKGROUND OF THE INVENTION

The present invention is directed to real time oscilloscopes, and more particularly to real time oscilloscopes employing a bandwidth extension scheme (i.e. Digital Bandwidth Interleaving), such as that described in U.S. patent application Ser. No. 11/281,075, titled HIGH BANDWIDTH OSCILLOSCOPE, filed Nov. 17, 2005 ("the '075 application"), currently pending, the entire contents thereof being incorporated herein by reference. In accordance with the disclosure of this pending patent application, each of a plurality of channels (two, for example, which will be referred to as LF (low frequency) and HF(high frequency)) receive a portion of an input signal corresponding to a specific frequency band. As described in the above application, additional processing is performed on this split signal for acquiring and digitizing the signal. In accordance with the present invention, further modification to this process of the '075 application is presented.

The DBI technique referenced above allows extending the bandwidth of Digital Storage Oscilloscopes (DSO's) by using bandwidth available in additional channels of the DSO to augment the bandwidth of a primary channel or channels. The application of such a DBI technique is limited not only by the bandwidth available on each channel but also by the necessity to leave sufficient distance between the bands for upsampling. Also, to allow for the use of the greatest amount of theoretically available bandwidth, the cross-over regions between adjacent bands have to be narrow, causing various challenges such as large group delay variations.

Ideally, two bands of width $f_S/2$, one extending between 0 and $f_S/2$ and the other extending between $f_S/2$ and $f_S$, can be combined into a channel of width $f_S$ and sampling rate 2 $f_S$. However, such a scheme appears to be physically impossible because no hardware filter structure can be made to transmit 100% frequencies below $f_S/2$, and transmit 0% frequencies above $f_S/2$, and vice versa. Furthermore, software filters encounter a similar challenge: no finite-length linear digital filter can upsample(interpolate) leaving the original frequency 100% intact and create 0% spur, when the frequency is nearly equal to Nyquist.

The invention is a method for setting the imperfections of software interpolation filter to be commensurate with the hardware filter imperfections. When the samplings of the channel connected with the low frequency are staggered in between the samplings of the high frequency channel, and the interpolation filter taps are set equal to the other channel's input response scaled values, a substantially perfect cancellation (to the level of precision of the instrument) of terms appearing at the wrong frequency can be achieved in accordance with the invention. This is analogous to the well-known aliasing-canceling condition of filterbanks, and the description will show similarities and differences between the present invention and this specific digital filtering technique.

As presented in the '075 application, $f_{LO}$ represents the frequency of the mixer's LO (element 43 of FIG. 2 in the '075 application). $f_S$ represents the sampling frequency of the digitizers (elements 5, 6, 7, 8 of FIG. 1 in the '075 application). In such a system, $f_{LO}$ would be equal to $f_S$, with half the bandwidth [0 to $f_S/2$] going to the LF channel and half the bandwidth [$f_S/2$ to $f_S$] going to the HF channel. As noted above, it has been determined by the inventor of the present invention that when one tries to build such a system employing the maximum theoretical bandwidth, two phenomena impede optimal operation, namely the width of the hardware filters and the width of the software interpolation filters. In accordance with the present invention, the inventor herein presents a technique that circumvents these limitations.

SUMMARY OF THE INVENTION

As noted above, when attempting to build the above described system using maximum theoretical channel bandwidth by setting $f_S=f_{LO}$, the inventor of the present invention has determined that two phenomena hinder optimal operation.

First, any filter or diplexer employed to split the input signal into the two specific frequency bands will always have a non-zero "crossover bandwidth." (the element highlighted by FIGS. 23 and 24 in the '075 application). There will, therefore, be a particular portion of the bandwidth that will be included in the signal sent into both channels, even though this portion of the bandwidth should be properly included in only one of the frequency bands, and thus sent to only one of the channels, either LF or HF. Any signal within this crossover bandwidth will pass through to both the high frequency channel and the low frequency channel with comparable power and amplitude. As a result, for example, a portion of the signal that is within the high band, and therefore belongs in the high frequency channel, will arrive in the low frequency channel, and will be interpreted as if it were a low-frequency signal, along with all of the other signals that are actually low frequency and belong in the low frequency channel. The same is true for low frequency signals in the high band.

Such a signal of frequency f arriving in the wrong band causes a large spur (~0 dB, meaning the spur is nearly of a size equal to the size of the correct signal) at the wrong frequency, because the frequency received at the channel is above the Nyquist limit of $f_S/2$. When this occurs, the amount of frequency error is two times $f-f_S/2$, changing f into $f-2(f-f_S/2)$, namely into $f_S-f$. It is well known that the phenomenon of aliasing occurs when frequencies above the Nyquist limit are input into a sampling circuit, and that this phenomenon causes the same frequency error as a function of frequency (see for example the article by Ruwan Welaratna—"Effects of Sampling and Aliasing on the Conversion of Analog Signals to Digital Format"—Sound and Vibration magazine, December 2002).

Secondly, the inventor of the present application has recognized another phenomenon hindering the use of the maximum theoretical available bandwidth. This phenomenon causes a problem even if all signals are received in the correct frequency channel. The sin x/x upsampling referred to in the above '075 application is performed with a finite number of points. Namely, element 95 in FIG. 11 in the '075 application is equal to 30, for example. Such a combination of an upsampler and filter has a non-ideal rejection for artifacts generated at frequency $f_S-f$, as noted in the discussion by Julius O. Smith III (see Smith, Julius O., MUS420/EE367A Lecture 4A, Interpolated Delay Lines, Ideal Bandlimited Interpolation, and Fractional Delay Filter Design, Stanford University) also referred to by the '075 application. In general, the rejection of unwanted frequency components provided by a truncated Sinc is fairly good. But, when approaching the Nyquist limit ($f_S/2$), the truncated Sinc filter fails to reject an undesired frequency because it is just too close to the desired frequency, and both are part of a curve with a finite slope.

FIG. 16 of the present application shows an example of an upsampling process performed with an upsample distance of 30 (this upsample distance of 30 defining, in the '075 application, the fact that the Sinc function is truncated at 30 terms). The inventor of the present invention notes that such a truncated Sinc filtering fails to regenerate only the intended frequency when f=0.49 $f_S$. This issue can be mitigated by increasing the upsample distance beyond 30. In any case, however, the issue remains if the input frequency is made equal to $f_S/2$ to a precision better than the frequency resolution of the truncated Sinc filter, as long as the filter has a finite number of taps, i.e. a finite upsample distance, such a filter will fail. Ultimately, this second phenomenon results in a large (order 0 dB) spur at $f_S$-f. (the same frequency noted above).

Therefore, the inventor of the present invention notes that these two sources of spur, one of hardware origin, the other of software origin, result in the presence of the same erroneous frequency. And therefore, in accordance with the invention, the inventor has proposed a method and apparatus that uses these two spurs to cancel each other out.

In such a method and apparatus in accordance with the invention, an adaptive upsampling for the high frequency band acquired data takes the place of the truncated sin x/x upsampler. In other words, element 80 of FIG. 10 in the '075 application is preferably replaced by block 80 of FIG. 11 in the present application. The interpolation thus preferably comprises a FIR taps somewhat different from sin x/x used in place of a true sin x/x function to upsample the signal by a factor of 2. The values of the filter taps, instead of being taken from the sin x/x function, are taken from consecutive points on a normalized and averaged low frequency impulse response, measured during a dedicated calibration step that will be shown below (see FIG. 6c). Similarly, an adaptive upsampling of the low frequency band takes the place of the truncated sin x/x upsampler. Namely, element 73 of FIG. 10 in the '075 application is preferably replaced by block 73 of FIG. 11 in the present application. The sin(x)/x-related filter taps are preferably replaced by consecutive points on the averaged high frequency impulse response, as measured during a dedicated calibration step that will be shown below (see FIG. 6b). Thus, in accordance with the invention, it is deliberately chosen to make the software imperfections the same size as the hardware imperfections.

Apart from the small effect of "leakage" or "crosstalk", which will be discussed below, the cancellation between the spurs that results from this process is intrinsically substantially perfect (again, to the level of precision of the instrument). This cancellation between the two spurs then leaves us with a generally simple linear and finite(non-zero) response at all frequencies.

Actually, the finiteness (non-zero-ness) happens only if the samples coming from the LF band and the samples coming from the MF band are independent enough; i.e. if the system is in a "quadrature" condition at $f_S/2$. Such a "quadrature" condition takes place if the samples are at their minimum amplitude in one channel while at their maximum in the other channel and vice-versa, and the interpolated points from one band line up with the original points of the other band, and vice-versa.

With respect to the '075 application, the present invention achieves a number of benefits. Some changes simply related to the change of operation frequencies are first noted. Hardware employed by the DSO to implement the present invention preferably modifies diplexer (elements 29, 31, and 33), and filters (elements 34, 37) of FIG. 2 of the '075 application so that the crossover frequency is 5 GHz instead of 6 GHz (see FIG. 10 of the present application), and the diplexer does not have to have a very narrow crossover. In accordance with the present invention, element 53 of the '075 application is preferably removed, as the full frequency range receivable by the channel dedicated to high frequencies can be used. Element 30 of the '075 application is preferably removed, as the presence of a $f_{LO}$ signal is no longer a threat to performance. Rather its presence amounts to a shift of the DC level in the channel, which can be calibrated away. The design of the present invention does not need special equipment to generate, track or filter out $f_{LO}$, thus preferably avoiding the need for elements 43, 44, 45, 46, 47, 48, 49, 50, 52, 54, 55, 56, 57, 58, 59, 60, 61, 62, and 63 of the '075 application. On the software front, many filters used in the "075 application (74, 75, 81, 82, 88) are preferably not needed, as the removal of various spurs is performed differently (i.e. without generic filters) in accordance with the invention. The generation of a software version of $f_{LO}$ is preferably not needed, justifying the preferred removal of elements 86 and 87 of the '075 application. The most notable changes comprise the preferred modification of elements 73 and 80, and thus the trivialization of elements 83 and 84, of the '075 application.

Still other objects and advantages of the invention will in part be obvious and will in part be apparent from the specification and the drawings.

The invention accordingly comprises the several steps and the relation of one or more of such steps with respect to each of the others, and the apparatus embodying features of construction, combinations of elements and arrangement of parts that are adapted to effect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which:

in FIG. 2a, the invention is not employed. In FIG. 2b, the invention is used;

DETAILED DESCRIPTION OF THE PREFERRED EMBODIMENTS

The invention will now be described making reference to the accompanying drawings.

Figure 1:
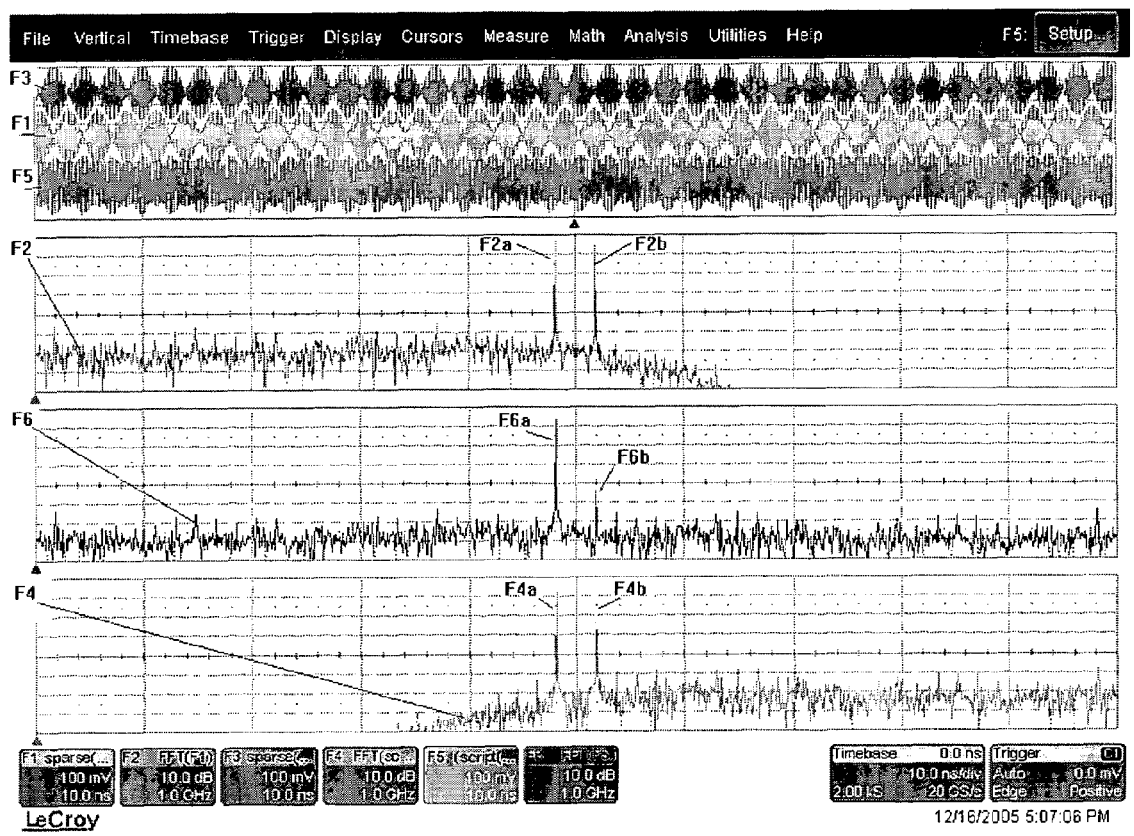
FIG. 1 is a screen shot representation of a number of signals displayed on an oscilloscope depicting the functionality of an embodiment of the invention, when a sinewave is fed to the oscilloscope.

FIG. 1 depicts the functional results of the invention when applied to a DBI equipped oscilloscope. As is shown in FIG. 1, a signal F1 is received by the oscilloscope. Signal F1, of a frequency just below the Nyquist limit, is depicted as being received on a time domain scale for the horizontal axis. When this signal is acquired by a LF channel (see element 32 of FIG. 10 below), upsampled (see block 73 of FIG. 11 below) and fast-fourier transformed (FFT) into the frequency domain along the horizontal, a frequency spectrum F2 results. Note in F2, not only is a first peak F2a generated, a second, undesirable peak F2b is generated from the aforementioned interpolation near the Nyquist limit. Similarly, when the same input signal passes through the mixing and amplifying elements 33-45 and 50-52 of FIG. 10 below, a signal is acquired by a HF channel (see element 63 of FIG. 10 below), upsampled (see block 80 of FIG. 11 below) and multiplied by the clock (see element 83 of FIG. 11 below) and there results an acquisition F3. F3 is then fast-Fourier transformed into the frequency domain, so that a frequency spectrum F4 results. In signal F4, not only is a first undesirable peak F4a generated (at a correct frequency but in the wrong channel), but an equally undesirable second peak F4b is generated within the bounds of the high-end frequency band, even though the peak should only be actually present in the low-end portion of the input signal. In accordance with the invention, under particularly controlled circumstances, the summing of the F1 and F3 signals results in signal F5 (before taking the FFT thereof). When the FFT is taken, a frequency domain signal F6 is generated. As should be noted, peak F6a, actually present in the input signal, is shown, while a second peak F6b is substantially reduced in size relative to, for example peak F4b. The vertical drop of the peak F4b may seem qualitatively small, but it is very significant considering the FFT are displayed on a log magnitude scale. Thus, in accordance with the invention the undesirable spur is removed, or at least reduced.

Figure 2A:
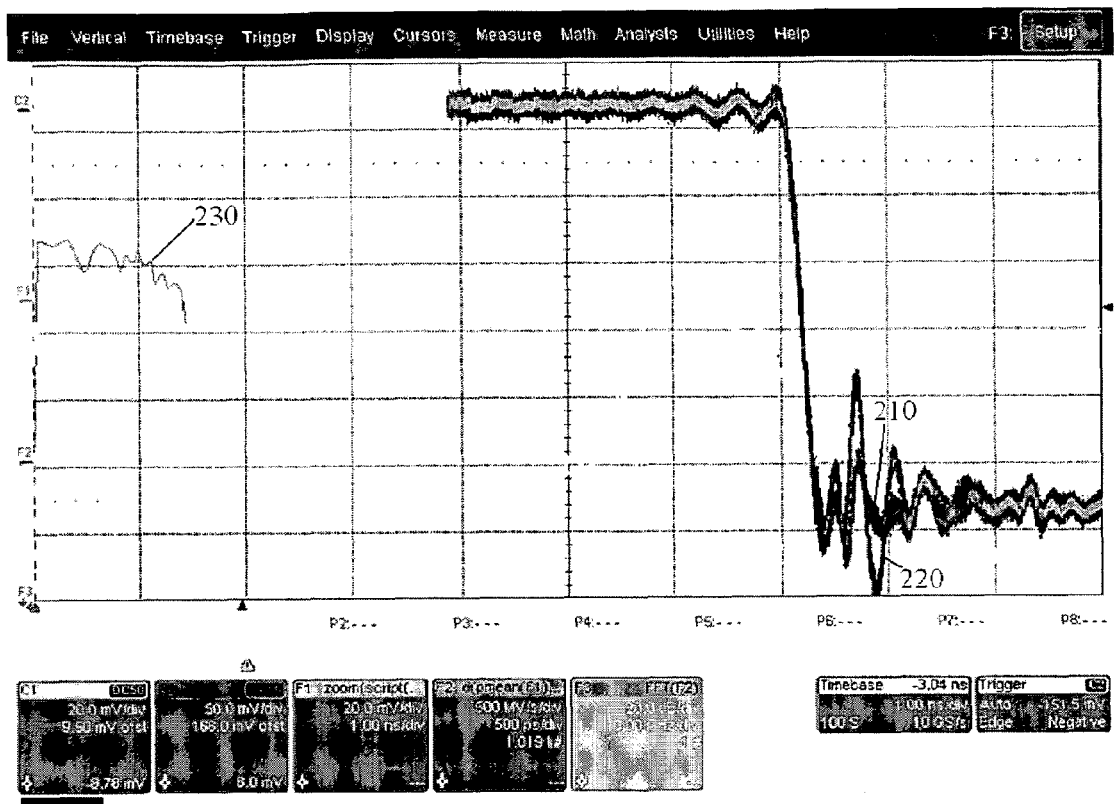
FIGS. 2a and 2b are screen shot representations of a number of signals displayed on an oscilloscope depicting the functionality of an embodiment of the invention, when a negative edge is fed to the oscilloscope.
Figure 2B:
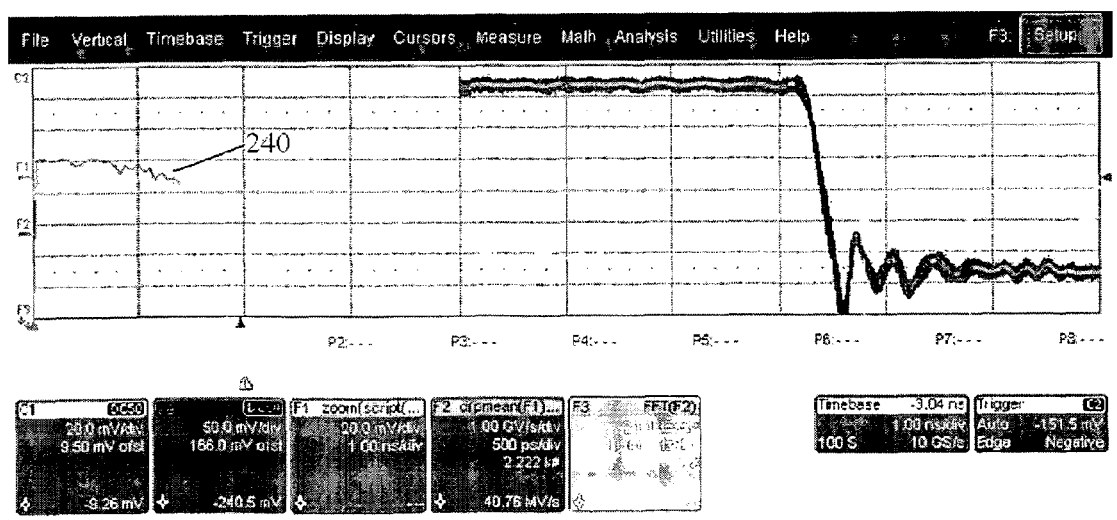

FIG. 2a shows a persistence display of several acquisitions of an input signal that is a downward step (negative edge), on a DBI oscilloscope where $f_{LO}=f_S$ but adaptive upsampling in accordance with the present invention is not used. The trace divides in two traces (210,220), because of the presence of spurs that disturb the normal acquisition of the signal. In FIG. 2b, the same persistence display is shown after employing the adaptive upsampling scheme of the invention. The trace does not divide in two distinct traces. Note, on the left hand side of the displays, where calculations of the FFT of the derivative of the averaged persistence waveform are shown, that the bandwidth of the DBI scope is larger than 10 GHz in both cases. However, when not using the scheme of the invention, the signals located near $f_S/2$ and acquired simultaneously by both bands can interfere destructively and reduce the bandwidth (230 on FIG. 2a). When using the invention, the response of the oscilloscope does not drop near $f_S/2$ (240 on FIG. 2b).

Figure 3A:
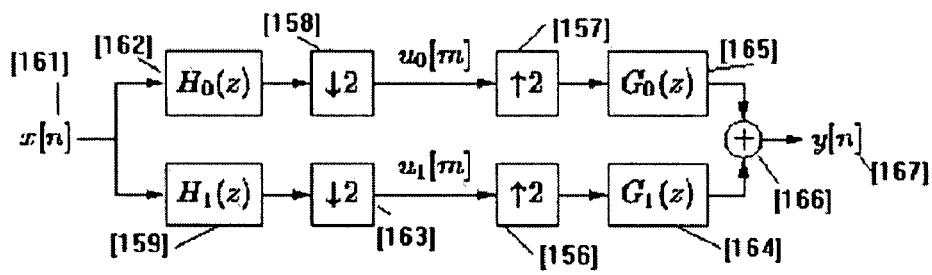
FIGS. 3a-3e represent a technique entitled of "Aliasing-Cancellation Conditions of Filterbanks", and its various modifications in accordance with the present invention.
Figure 3B:
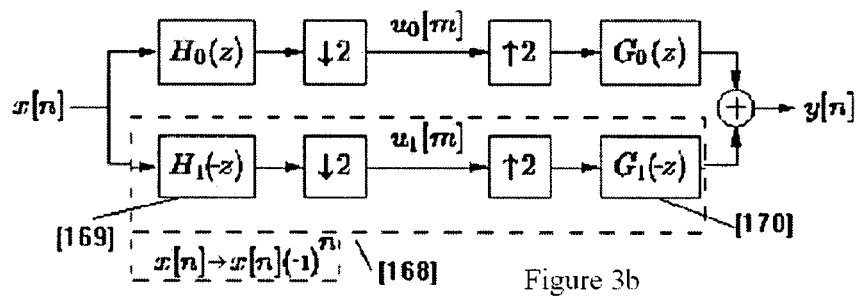
Figure 3C:
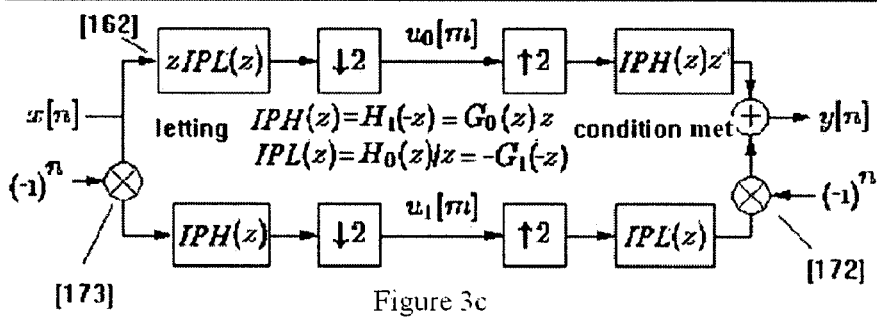
Figure 3D:
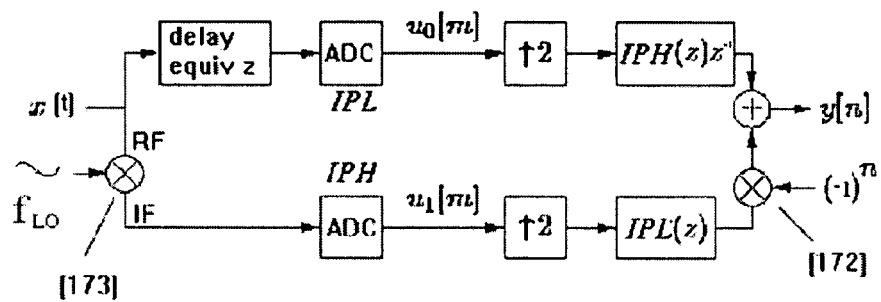
Figure 3E:
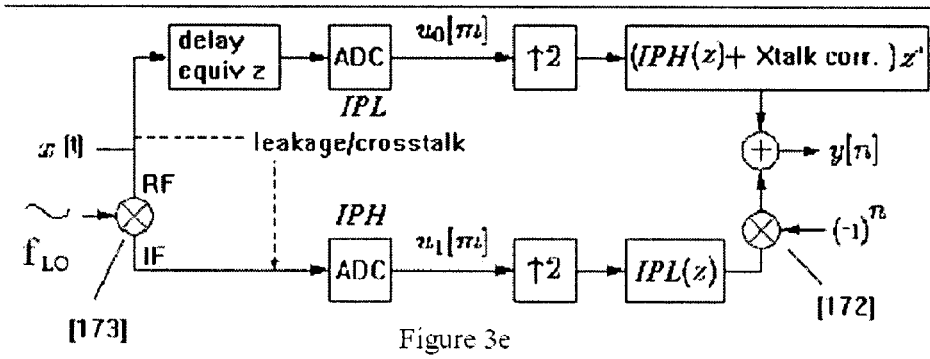

Referring next to FIGS. 3a-3e, a block diagram sequence depicting various processing methods is shown. The FIGS. 3c, 3d, and 3e show processing in accordance with the invention. In FIG. 3a a known technique, the cancellation of aliasing in a filterbank, is shown. This technique is explained in an article of Phil Schniter (Schniter P. Aliasing-Cancellation Conditions of Filterbanks (Connexions Web site for Ohio State University course EE700), Sep. 16, 2005, and the references therein, such as R. E. Crochiere and L. R. Rabiner. (1981, March), Interpolation and Decimation of Digital Signals: A Tutorial Review. Proc. IEEE, 69(3), 300-331). As is first shown in FIG. 3a, a numeric input signal labeled 161, consisting of a series of numeric values (or samples) at integer indices n, is simultaneously fed to two distinct numeric filters labeled 162 and 159. The filtered result from filter 162 is forwarded to a down sampler 158 (or sparser), that lets only samples with even indices pass. The filtered result from filter 159 is similarly forwarded to a separate down sampler (or sparser) 163 that lets only even samples pass. The first sparsed signal $u_0[m]$ is then forwarded through an upsampler 157, that inserts zero samples in between each sparsed sample, and passed to a numeric filter 165 before reaching the first input of an adder 166. The second sparsed signal $u_1[m]$ is forwarded through an upsampler 156, that inserts zero samples in between each sparsed sample, and through a numeric filter 164 before reaching the second input of the adder 166. The resulting signal 167 from adder 166 is free of distortions related to aliasing, if and only if a certain condition between the filters (labeled 162, 159, 165 and 164) are met, namely if the product $H_0(-z)G_0(z)$ is equal to the opposite of $H_1(-z)G_0(z)$. This will be called the Schniter condition. A simple set of filters fulfilling the Schniter condition is $H_1(z)=G_1(z)=1$, $H_0(z)=z$ and $G_0(z)=z^-1$. This scenario represents a situation where even samples travel though $u_1$ and odd samples though $u_0$.

In FIG. 3b, one change in accordance with the invention is implemented from the known design of FIG. 3a. In a region enclosed by the dashed line 168, it is stated that the signal is made up from a series of numeric values where the odd samples have their sign changed. To reproduce the original series in such a situation, it is necessary to replace filter 159 with filter 169 (noting a function of −z, rather that z) and replace filter 164 with filter 170 (noting a function of −z rather than z). This is necessary because samples located at distances represented by odd integers are virtually the opposite of what they were in FIG. 3a.

In FIG. 3c, two additional changes from the design of FIG. 3b are implemented. In order to actually implement the supposition of FIG. 3b, the odd samples passed to filter 169 are multiplied by −1 at multiplier 173. To generate a result similar in value to the input signal, a corresponding multiplication of odd samples by −1 must also be implemented at 172, when the signal exits processing. The labels of the boxes, $H_0(z)$, $H_1(-z)$, $G_0(z)$, $G_1(-z)$ are replaced by new labels z IPL(z), IPH(z), IPH(z) $z^{-1}$ and IPL(z) such that the Schniter condition is satisfied. These new labels reflect the nature of a preferred embodiment of the present invention. IPH denotes the taps of the adaptive interpolation for the LF channel in accordance with the invention, which are measured on the impulse response of the HF channel. IPL denotes the taps of the adaptive interpolation for the HF channel, which are measured on the impulse response of the LF channel. In this FIG. 3c, the system is fully digital, but channels are called "LF" and "HF", because of the band of frequencies primarily carried by the channel. Such a system might be used in a transmission application where some users can tolerate errors in the high frequency (they might have an imperfect second transmission channel), and others want perfect transmission (they would require two perfect transmission channels).

In FIG. 3d, one further difference is implemented from the system depicted in FIG. 3c. Rather than a software multiplication process, a multiplication by a changing sign is implemented in hardware, specifically by a mixer 173, the signal therefore being mixed with a signal having a frequency of $f_{LO}$. The numeric filtering and sparsing are replaced by analog-to-digital conversion at half the digital signal rate, represented by the "ADC" boxes. The "z" part of element 162 of FIG. 3c cannot be replaced directly by an analog element, but can be practically achieved by an analog delay line (shown as a box "delay equiv. z"), or even more simply by an adjustment of the sampling delay of LF channel ADC, if such an adjustment is available (and such an adjustment is available as a JTAG-programmable 12-bit register in the preferred embodiment of the invention).

FIG. 3e shows that a non-ideal mixer may actually have leakage between RF and IF, which amounts to crosstalk letting non-frequency-shifted signals to enter the processing chain intended for frequency shifted signals. It shows that, in accordance with this invention, the problem can be solved with the addition of a specially designed, calibration measured, cross-talk correcting response to the impulse response of the "HF" channel, generated in accordance with an algorithm described in FIG. 6b below. The need for "leakage/crosstalk" correction depends on the wanted instrument performance and the available mixer performance. If one does not desire the improved performance, the special correction is set to zero and one is back to the simple situation of FIG. 3d.

While the theory behind the adaptive interpolation of this invention has just been simply described, a practical application of the invention requires a well defined calibration process, which will be described below.

A frequency-domain explanation of how and why signal spurs cancel in accordance with the invention will now be described. This description will note some similarity between this invention, the known techniques of signal retrieval via quadrature, and the technique of correction of interleaving errors (Mueller, et al., U.S. patent application Ser. No. 11/280,493, entitled Method and Apparatus for Artifact Signal Reduction in Systems of Mismatched Interleaved Digitizers, currently pending, the contents thereof being incorporated herein by reference). However, the applications of the various features of this invention are considered to be novel and non-obvious in light of these other techniques.

If a tone (sinewave) of amplitude $t_L$ at frequency f (less than $f_S/2$) superimposed on a tone of amplitude $t_H$ at a frequency $f_S-f$ is fed to the input of the invention, and if there was a double sample rate, the LF channel would receive $Lt_L$ at f and $lt_H$ at $f_S-f$, and the HF channel would receive $Ht_H$ at f, and $ht_L$ at $f_S-f$. The variables L, l, H and h, are simply the Fourier components of the hardware impulse response measured on the unit during a calibration phase, at the frequencies noted above. But, due to the single "low" sample rate of just $f_S$, both channels actually have samples that are sinusoidal with a frequency f. The LF channel has an amplitude $m_{LF}=Lt_L-lt_H$, while the HF channel has an amplitude $m_{HF}=Ht_H^*+ht_L^*$. Notice that the amplitudes are summed on the HF channel (because we chose the even samples, and at t=0, all frequencies add) while the high frequencies are subtracted on the LF channel, because of a minus sign coming from the offset by half a sample (specifically, from the fact that $z^*(f)z^{-1}(f_S-f)=-1$). Thereafter, by inserting zero samples in between the measured samples in the LF channel, tones of both frequencies f and $f_S-f$ are produced, with amplitudes ½ $m_{HF}$ and ½ $m_{LF}^*$ respectively. Similarly, the insertion of zeros in between the samples in the HF channel produces tones of both frequencies f and $f_S-f$, with amplitudes ½ $m_{HF}$ and ½ $m_{HF}^*$ respectively.

This phenomenon takes place in elements 74 and 81 of FIG. 11 below, which are representing again the "↑2" boxes of FIG. 3 above. Next, FIR filtering (elements 75 and 82 of FIG. 11 below) occurs. In general, four coefficients can represent the effect of filtering. While this invention specifies the value of four these coefficients, let them be represented by $\mathcal{L}$ (acting on low frequencies in the LF channel), λ (acting on high frequencies in the LF channel), $\mathcal{H}$ (acting on low frequencies in the HF channel), η (acting on high frequencies in the HF channel), and let the description begin assuming that their optimal values are as of yet unknown. The amplitudes of the low and high frequency tones in the LF channel are therefore respectively ½$\mathcal{L}Lt_L$−½$\mathcal{L}l^*t_H^*$ and −½$\lambda L^*t_L^*$+½$\lambda lt_H$, and the amplitudes of the low and high frequency tones in the HF channel are ½$\mathcal{H}h^*t_L$+½$\mathcal{H}Ht_H^*$ and ½$\eta ht_L^*$+½$\eta H^*t_H$ respectively. The process of remultiplication by $\cos(2\pi f_S t)$ uprights the bands, making the amplitudes ½$\eta^*h^*t_L$+½$\eta^*Ht_H$ and ½$\mathcal{H}^*ht_L^*$+½$\mathcal{H}^*H^*t_H$ as far as frequencies f and $f_S-f$ are concerned, respectively. When the signals are summed, the total amplitude at frequency f and $f_S-f$ are $$\mathcal{A}_L=\tfrac{1}{2}(\mathcal{L}Lt_L-\mathcal{L}l^*t_H^*+\eta^*h^*t_L+\eta^*Ht_H)$$

$$\mathcal{A}_H=\tfrac{1}{2}(\mathcal{H}^*H^*t_H+\mathcal{H}^*ht_L^*-\lambda L^*t_L^*+\lambda lt_H).$$

At this point it can be seen that it is possible for $\mathcal{A}$ to depend only on $t_L$ and not at all on $t_H^*$, and for $\mathcal{A}$ to depend only on $t_H$ and not at all on $t_L^*$. All that is necessary is to maintain $\mathcal{L}^*=\eta^*H$ and $\lambda^*L=\mathcal{H}h^*$. This situation is obtained in the impulse calibration technique presented first in this invention by letting $\mathcal{L}$=H/sum, η=1/sum, λ=h/sum and $\mathcal{H}$=L/sum. Here sum is the value of H for f approaching zero (the same variable used in FIG. 6b). Another possibility is to start with $\mathcal{L}$=1 and $\mathcal{H}$=norm. Then λ=(h/L*) norm* and η=1/H* are sufficient to null the spurs. This is a distinct calibration method, which does not necessitate the use of an impulse generator but can instead be handled by a sinusoidal wave generator, and which will be addressed with respect to the description of FIG. 14 below. In this case the calibration is different but the usage steps remain the same (bottom of FIG. 4, FIGS. 7 and 8, and FIG. 11).

Note that quadrature is not necessarily needed for canceling the spurs. However, it is useful to maintain quadrature to avoid worsening the signal over noise. To be able to see this fact, note that in a matrix notation, the reconstructed signal amplitudes depend on the input tone amplitudes in the following manner:

$$\begin{pmatrix} \mathcal{A}_L \\ \mathcal{A}_H^* \end{pmatrix} = \frac{1}{2} \begin{pmatrix} \mathcal{L} & \eta^* \\ -\lambda^* & \mathcal{H} \end{pmatrix} \begin{pmatrix} L & -1^* \\ h^* & H \end{pmatrix} \begin{pmatrix} t_L \\ t_H^* \end{pmatrix}$$

Thus, the problem of canceling the spurs is equivalent to one of matrix inversion; or at least matrix diagonalization. For the inversion to be possible, the determinant LH+1*h* must be non-zero at all frequencies. This is most challenging near Nyquist because there 1 and h are nearly of equal size as H and L. To avoid a near-zero determinant, the key is to adjust the sampling points such that the two channels sample differently. This is actually performed in FIGS. 6$b$ and 6$c$ by making the two channels sample identically and then shifting the LF sampling point by $\frac{1}{2}f_S$. If either sampling point were shifted again by $\frac{1}{2}f_S$, then H or L would be imaginary at $f_S/2$, and the determinant would be the sum of a complex number plus nearly its conjugate, and it would become nearly zero.

The above cancellation of frequency changing components takes care of the worst problem associated with setting $f_{LO}$ equal to $f_S$. However, a secondary common problem of real-world mixers is the presence of non-converted signals in the IF output, that "crosstalk" (leak) from the RF input. The worst crosstalk is typically generated in a region near $f_S/2$. In the limit where there is no such cross-talk, the LF channel's upsampler filter taps would just be taken from the impulse response of the H channel. However, in the presence of crosstalk, this simple scheme has to be adapted. To remove its effects, the H channel response attributable to crosstalk must first be identified and removed. Then, since this crosstalk is appearing at the wrong frequency in the final result, a more elaborate correction than just a subtraction should be performed, specifically, the crosstalk must be added back—frequency reversed. A specific calibration step (such as step 328 of FIG. 6$b$ below) explicitly identifies the crosstalk component of the response. Subtracting twice this component on odd samples alone (as shown by step 365 of FIG. 6$b$) effectively subtracts the crosstalk, and adds a frequency-reversed version of it, since sign change on odd samples is equivalent to frequency reversal. The reason why this curious method works appears clearly if we inspect the two generated spur amplitudes:

$(\frac{1}{2}\mathcal{H}^*h-\frac{1}{2}\lambda L^*+\frac{1}{2}\mathcal{H}^*X^*)t_L^*$ and $(\frac{1}{2}\eta^*H-\frac{1}{2}\mathcal{L}^*1^*+\frac{1}{2}\Theta^*T^*)t_H^*$ where X and H are the crosstalk's complex gain at f and $f_S$–f respectively. While still letting $\mathcal{H}$=L and $\eta$=1, if we now say $\mathcal{L}$=H+T* and $\lambda$=h+X*, the two spurs' complex amplitude keeps being equal to zero even though X and T are non-zero.

Figure 14:
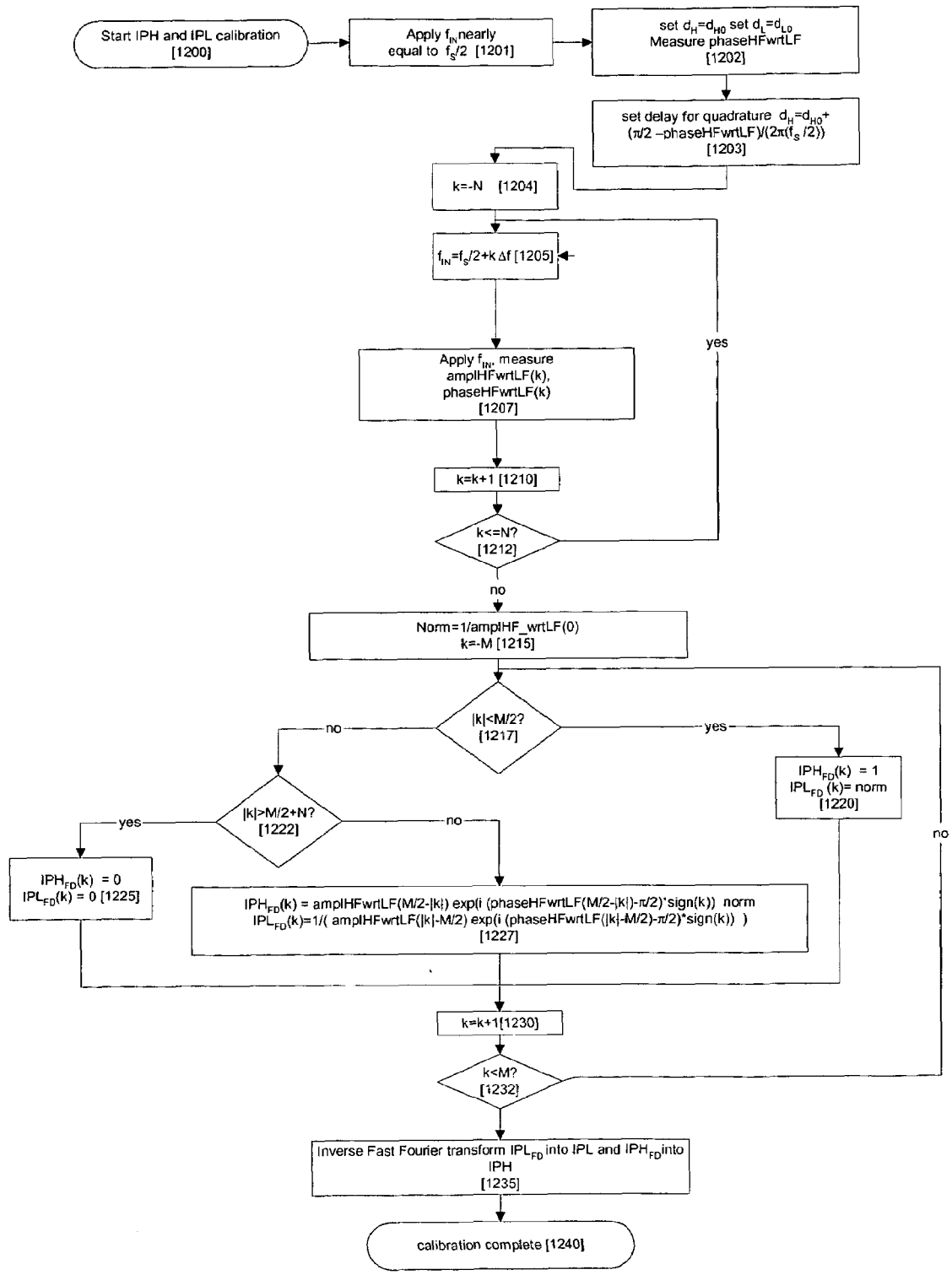
FIG. 14 shows the flowchart of an alternate way to create adaptive upsampling FIR taps based on a frequency sweep.

In the case of the calibration algorithm of FIG. 14, the presence of spurs related to crosstalk can be similarly avoided by letting h→h+X* and H→H+T*. The specific calculation details are described below with respect to the discussion of FIG. 15.

The mathematics of spur cancellation in DBI scopes where $f_S=f_{LO}$, defined above, indicates that for each exact hardware situation, there exists one or several exact and particularly adapted upsampling methods that makes the spurs cancel. Among others, two calibration methods that can be used to measure the instrument response in its two bands will be presented. One, which will be referred to as the time-domain calibration method, has the advantage of apparent simplicity—no difficult calculation is required, only averaging, additions and subtractions. The FIR taps that are employed are simply read from the instrument impulse response. The other method, which will be referred to as the frequency-domain calibration method, is slightly more complicated, involving Fourier transforms and an adequate approximate sampling of the Bode plot of each channel of the instrument, but it deals with the case where the HF channel has no DC response, and only requires off-the-shelf sine signal generators. Yet other methods of calibration exist (in fact, any method that meets Schniter's conditions), but two exemplary methods shown below suffice to illustrate the range of application of the present invention.

Figure 4:
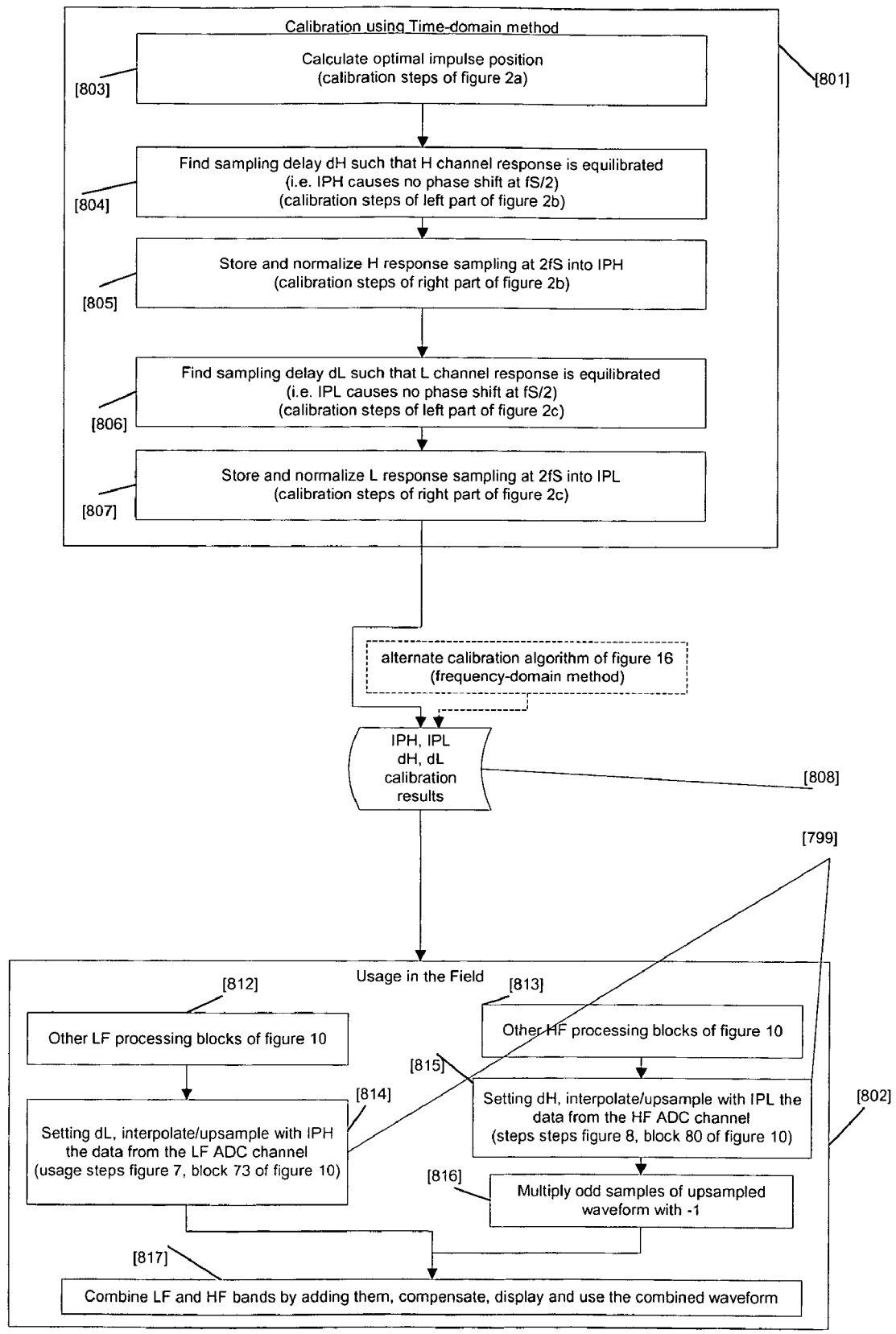
FIG. 4 is a flow chart representation of the preferred overall process steps for implementation of the invention.

Next FIG. 4 shows a global flowchart for implementing a preferred embodiment of the present invention, indicating calibration itself (portion 801, representing FIGS. 6$a$ through 6$c$ below), and use of such a calibration in the operation of a DSO (portion 802, representing FIGS. 7 and 8 below). In portion 801, a time-domain calibration requires a controlled application of a brief impulse (see a description of the hardware needed to generate a suitable impulse in FIG. 5 below). First, block 803 calculates the optimal impulse position, corresponding to the steps of FIG. 6$a$. Secondly, block 804 finds the sampling delay for H channel equilibration, corresponding to the steps of the left part of FIG. 6$b$. Thirdly, block 805 stores and normalizes IPH, corresponding to the steps of the right part of FIG. 6$b$. A fourth block 806 finds the sampling delay for the equilibration of the L channel, corresponding to the steps of the left part of FIG. 6$c$, and a fifth block 807 stores and normalizes IPL, corresponding to the steps of the right part of FIG. 6$c$. Finally, after calibration, when the DBI scope is in operation using the calibration results noted at block 808, its input may receive any signal whose samples will be processed by the adaptive upsampler blocks 799, a block 814 for the LF channel adaptive interpolation/upsampling corresponding to the steps of FIG. 7 and a block 815 for the HF channel adaptive interpolation/upsampling corresponding to the steps of FIG. 8. A block 812 employs the elements 71 and 72 of FIG. 11 and a block 813 employs the elements 78 and 79 of FIG. 11. Block 816 employs the elements 83 and 87 of FIG. 11, and block 817 employs elements 76, 89, 77 and 90 of FIG. 11. The blocks 812 and 813 summarize the operations that are done prior to adaptive interpolation/upsampling. The blocks 816 and 817 summarize the operations still having to be performed after the adaptive interpolation/upsampling is complete in order to achieve a correct signal. All that is necessary to allow the DBI oscilloscope to perform a correct job in accordance with the invention is to be provided with the results of the calibration data [808], preferably generated once (e.g., in factory) before use of the oscilloscope. These results are stored in the non-volatile memory of the DBI oscilloscope, and consist of the HF and LF channels sampling delays and the IPL and IPH filter taps.

Figure 5:
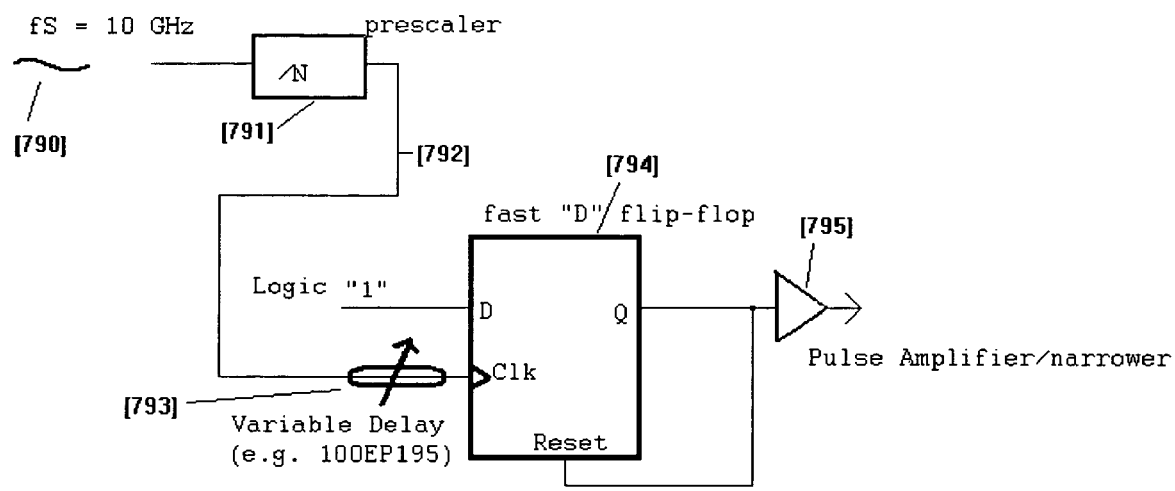
FIG. 5 depicts a representation of an example of hardware used to create a synchronized input pulse, which is used for the calibration steps of FIGS. 6a, 6b, 6c in accordance with a preferred embodiment of the present invention.

FIG. 5 shows an apparatus for generating a signal consisting of a very brief impulse, synchronous to the acquisition clock, at an adjustable delay. This apparatus is preferably used during time-domain calibration (steps of FIGS. 6$a$, 6$b$ and 6$c$ below), to adjust the sampling point timing and retrieve the IPH and IPL upsampling filter taps. A copy of the acquisition clock labeled 790 is fed to the input of a prescaler labeled 791, which has the purpose of separating the impulses by a sufficient number of samples to be able to distinguish them. Circuitry already present in the DSO's timebase and which can be output on its AUX OUT connector under program control can provide elements 790 and 791. The result is a logic signal (labeled 792) whose leading edges are synchronous to the sampling clock. A programmable delay element (labeled 793) is programmed with a delay $d_1$ which will be varied and adjusted during calibration. A flip-flop 794, which resets itself immediately after it is set high, is used to transform that edge into a brief impulse. To meet the requirements of this application, the pulse will be further sharpened (via sharpening element 795) into a pulse that is practically perfect as far as instruments of bandwidth $f_S$ are concerned. A PicosecondPulseLab model 4005-DRV pulser with a PicosecondPulseLab 4005PH-307-5.0V pulse head and a PicosecondPulseLab 5206-205 Impulse Forming Network can effectively provide elements 794 and 795. The implementation choice does not matter as long as a repetitive synchronous brief impulse is obtained.

Figure 6A:
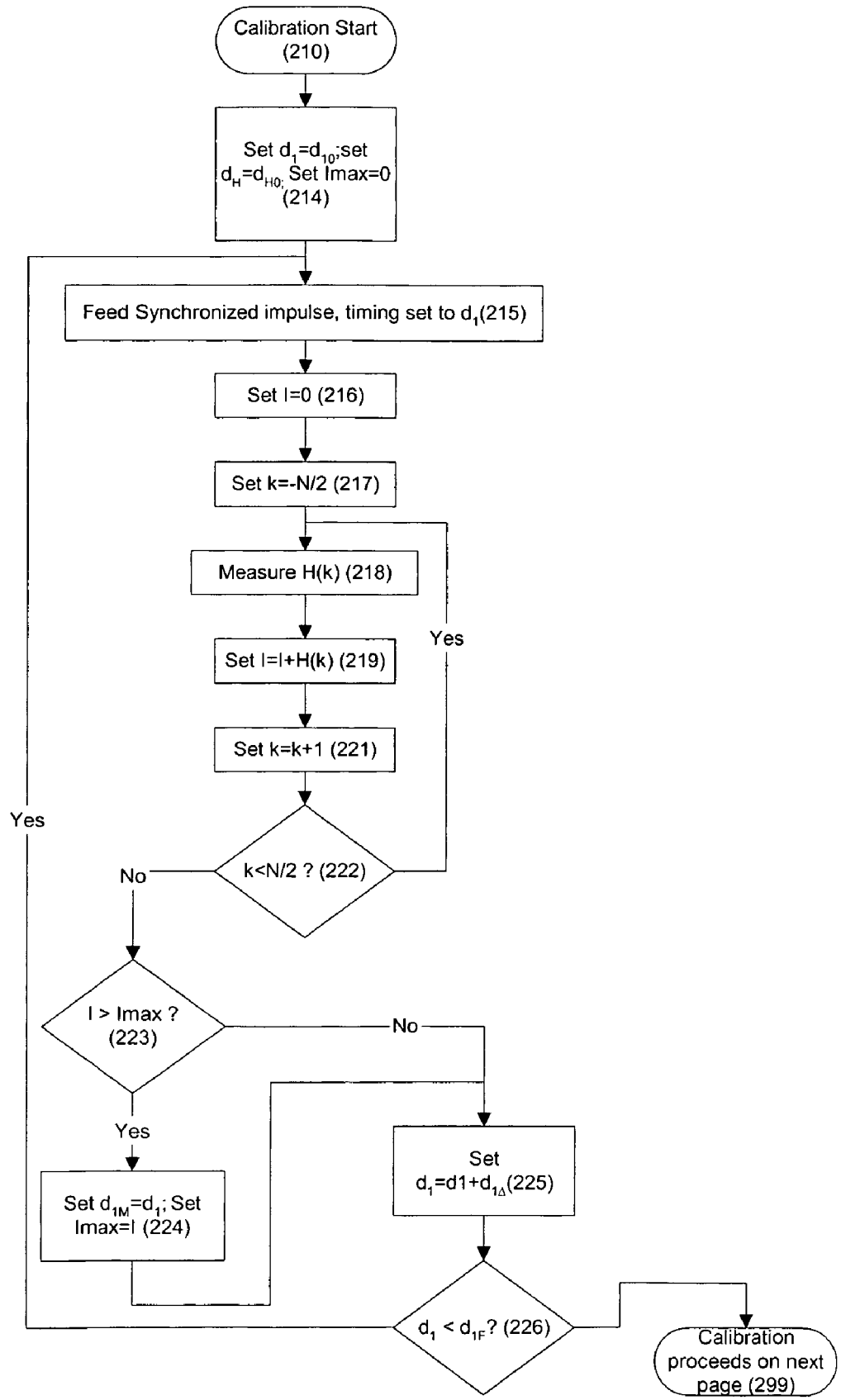
FIGS. 6a-6c comprise a flowchart diagram depicting a calibration process in accordance with a preferred embodiment of the invention, as shown in portion 801 of FIG. 4.
Figure 6B:
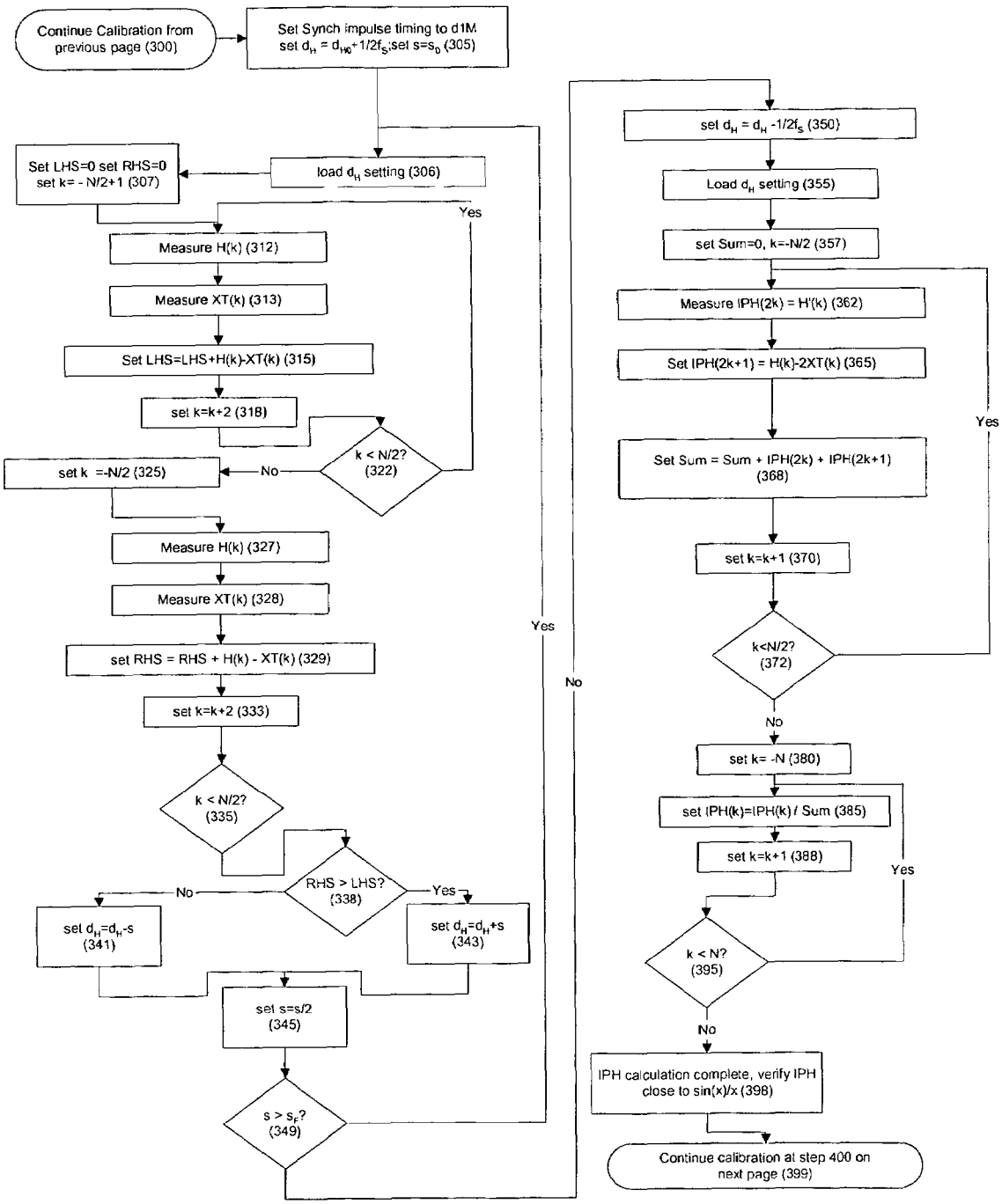
Figure 6C:
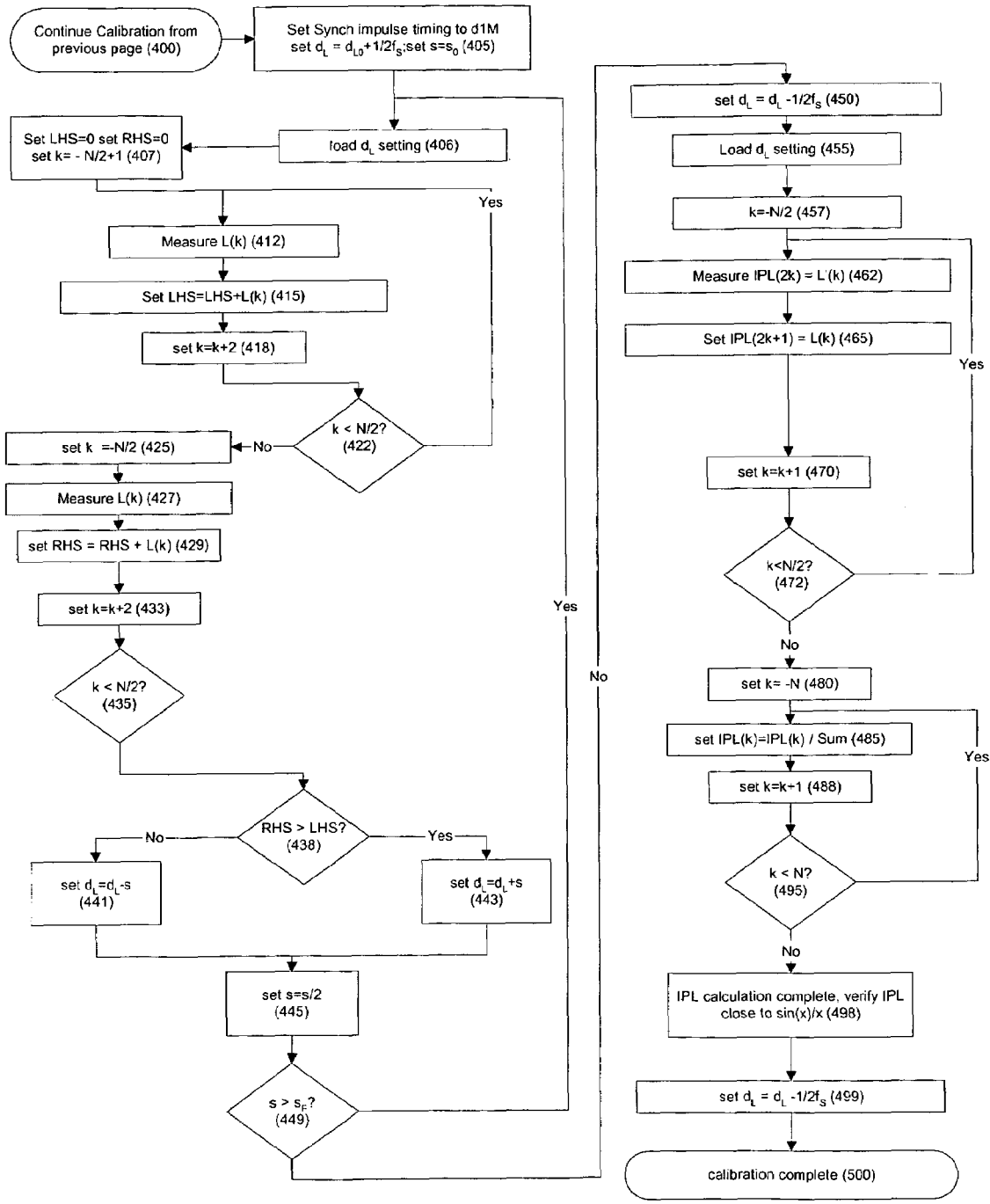

For the purpose of describing in detail the algorithms that achieve a substantially exact cancellation of the spurs, FIGS. 6a, 6b, 6c depict a step-by-step description of the calculation of filter taps based on the observation of the impulse response of the instrument in each of its channel. The resulting filter taps are then used in the adaptive upsamplers (blocks of elements 73 and 80 of FIG. 11), and achieve the goal of this invention.

Referring first to FIG. 6a, the timing of a synchronous calibration impulse is adjusted to maximize the DC component output into the HF channel (FIG. 5 just described above shows hardware that could be used to generate such an adjustable-delay synchronous impulse). At step 210 a calibration process is started, and at step 214, program variables are initialized. The variable $d_1$ represents a loop variable for a programmed scan of timing between a minimum timing of $d_{10}$ and a maximum timing of $d_{1F}$ by steps of $d_{1A}$, where typical values of ($d_{10}$, $d_{1F}$, $d_{1A}$) are (−100 ps, 100 ps, 1 ps), for example. Elements 215-226 represent a loop searching for the pulse maximizing value of $d_1$, which will be called $d_{1M}$. The variable Imax, initialized to zero, represents the temporary value of this maximum in the course of the search.

Here the function of algorithmic steps 215-226 will be further detailed. At step 215, the value of control register $d_1$ is loaded into the impulse delaying hardware register. Then steps 216-222 constitute a calculation of the DC component present via the calculation of "I". At step 223, the value of "I" is compared to Imax. If the value of "I" just evaluated exceeds the value of Imax, a new maximum has been found, execution proceeds to step 224 where this new maximum is recorded in variable Imax, and the value of $d_1$ where the maximum was achieved is recorded into variable $d_{1M}$, and then execution proceeds to step 225. If the result of the comparison of step 223 is a "No", execution simply continues directly to step 225. At step 225, the variable $d_1$ is increased by $d_{1A}$. At step 226, it is verified that $d_1$ is less than the end of the loop $d_{1F}$. If so, the loop continues (step 215). Otherwise, the loop has ended and execution proceeds to steps 299-300.

Discussing steps 216-222 that are calculating "I" in greater detail, first, at step 216, "I" is initialized to zero. Then, at step 217, the summation index k, a loop variable, is initialized to "−N/2". The origin of the index is at or very near the center of the impulse response. Here N is a positive integer (multiple of 4) that must exceed the length, in samples, of a record containing the full response of the HF channel to the brief impulse; a value of 100 is a typical one. At step 218, the average value of the data point number "k" on the HF channel, "H(k)", is measured. In the limit of low noise, this is just the plain hardware readout of the acquired data. In the presence of substantial noise, in order to improve the precision of the calibration, this could be the readout of the value resulting from averaging several acquisitions through the software machinery of the DSO. At step 219, H(k) is added into "I". At step 221, k is increased by 1. At step 222, k is compared with N/2. If k is less than N/2, the algorithm continues with the measurement of the next sample at step 218. Otherwise, the evaluation of the DC component is complete and execution continues into step 223 as described above.

Figure 10:
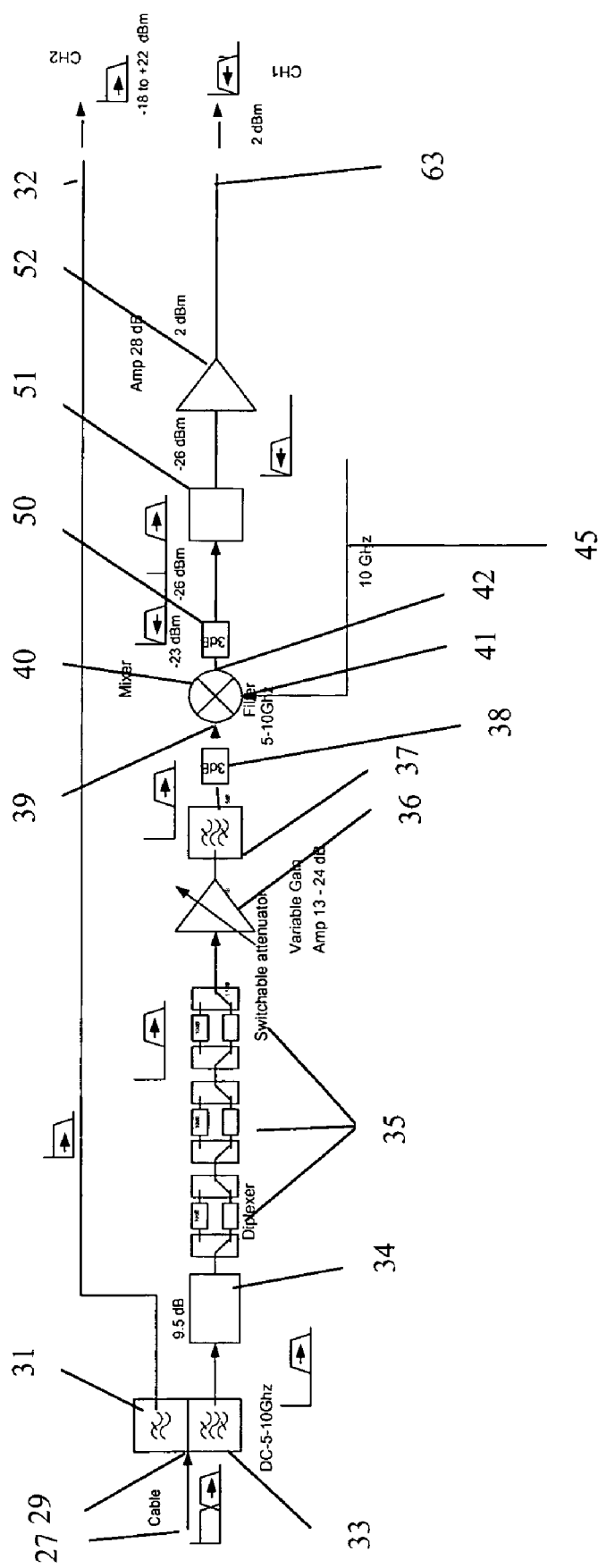
FIG. 10 is a block diagram depicting various hardware elements of the DSO in the preferred embodiment of the present invention.

Following the maximization of the DC component coming out of the HF channel by adjustment of the delay of a synchronous pulse, that was accomplished by steps 210-299 of FIG. 6a, the steps of FIG. 6b (numbered 300-399) and of FIG. 6c (numbered 400-499) perform the equilibration and normalization of the HF and LF responses respectively, yielding the values of the taps need for the modified upsamplers (elements 73 and 80 of FIG. 10 in the '075 application). There are very strong similarities in the calibration steps 300-399 and the calibration steps 400-499; to help identify those similarities the numbers associated with calibration steps performing similar functions differ only in the "hundreds" digit. Here, it should be explained that by equilibration, what is meant is the positioning of the sample points in such a way that a convolution of the acquired points with a "cosine" wave of frequency exactly $f_S/2$ would yield a cosinewave of the same frequency and same phase. To have the series of points ( . . . −1 0 1 0 -1 0 1 0 -1 . . . ) yield exactly the series of points ( . . . −A 0 A 0 -A 0 A 0 -A . . . ) it is necessary that the forward propagation terms be the same size and sign as the backward propagation terms. This is the reason for the calculation of "RHS" and "LHS" that take place here below.

In FIG. 6b, first, at step 300, the calibration initiated in FIG. 6a is resumed. At step 305, a hardware register controlling the delay of the synchronized impulse is reloaded with $d_{1M}$, establishing the conditions that yield a maximal DC response out of the HF channel. The program variable $d_H$ is set to $d_{H0}$ plus half a sampling clock period (50 ps in the preferred embodiment). The calibration parameter $d_{H0}$ represents a default initial digitizer sampling, typically about 200 ps in the preferred embodiment. A loop variable "s", controlling the size of the steps of the binary search to be described below, is initialized to "$s_0$". A typical value of "$s_0$" might be 64 ps. Calibration steps 306-349 then represent a binary search for a delay value that provides "equilibrium" between the right hand side of the response, denoted by RHS, and the left hand side of the response, denoted by LHS.

Steps 306-335 perform the calculation of LHS and RHS, which is described in more detail below. At step 338, the values of LHS and RHS are compared. If RHS is larger than LHS, indicating that the sampled waveform is too much on the "late" side, calibration proceeds to step 343, where the program variable $d_H$ controlling the sampling delay is increased by s, and loaded to hardware. Otherwise, calibration proceeds to step 341, where the program variable $d_H$ is decreased by s, and loaded to hardware. In either case, calibration then proceeds to step 345, where s is divided by 2. This means that the binary search will have twice the precision when (and if) it continues. At step 349, s is compared with $S_F$. The $S_F$ calibration parameter controls the precision of the adjustment and typically would have a value of 1 ps. If s is still larger than $S_F$, calibration continues returning to step 306. If not, the adjustment of $d_H$ is complete and calibration continues with the evaluation and normalization of the tap coefficients IPH, at step 350.

Calculation of LHS and RHS is performed in steps 306-335, as noted above. At step 306, the value of $d_H$ is loaded to a hardware register controlling the digitizer sampling delay on the HF channel. At step 307, to prepare for the evaluation of the sum of the left hand side and the sum of the right hand side, program variables LHS and RHS are initialized to zero, and the summation index k is initialized to $-N/2+1$. At step 312, the average response of the HF channel at index k, denoted by H(k), is measured (in a way similar to calibration step 218). At step 313, the average response of the HF channel at index k, in the absence of the LO mixing signal, XT(k), is measured. The existence of such a "crosstalk" component at the output of a mixer represents a parasitic response of the mixers, which will be quite small for the best performance mixers. In the limit of a negligible crosstalk, we approach the case of FIG. 3d. There can be an alternative to actually removing the LO signal being fed to the mixer: if one averages over a large number of acquisitions in a situation where LO is present, but is not phase related to the sampling clock, the same crosstalk samples XT(k) will be obtained.

Referring back to FIG. 6b, at step 315, the measured value H(k), less the part of the measured value due to crosstalk, XT(k), is added to LHS. Then, at step 318, the value of k is increased by 2. At step 322, it is tested whether k is still less than N/2. If it is still less, further evaluation of LHS is performed by returning control to step 312. Otherwise, execution proceeds to step 325. At step 325, the loop index variable is initialized to $-N/2$. This is so that the loop will now include point index 0. Control then passes to step 327, which performs an evaluation of the average response of the HF channel at index k, called H(k). At step 328, the part of H(k) due to crosstalk, called XT(k), is evaluated. At step 329, H(k), minus XT(k) is added into RHS. At step 333, the value of k is increased by 2. At step 335, it is tested whether k is still lower than N/2. If it is still less, further evaluation of RHS is performed by returning to step 327. Otherwise, execution proceeds to step 338, as the calculation of LHS and RHS are complete.

Following the adjustment of $d_H$ performed by steps 306-349 in the left side of FIG. 6b, further calibration steps are noted on the right side of FIG. 6b. Steps 350-372 of FIG. 6b build an array IPH of 2N values, and steps 380-399 normalize and validate this array in preparation for its use as filter taps.

Building of the IPH array will first be described. At calibration step 350, $d_H$ is reduced by half a sampling clock period (50 ps in the exemplary preferred embodiment). At step 355, a hardware register controlling the sampling delay of the HF channel is loaded with this updated value of $d_H$. The purpose is to accomplish a virtual doubling of the sampling rate by interleaving samples. Then at step 357, the program variable Sum is initialized to zero and the index variable k is initialized to $-N/2$. At step 362, the average value of the sample number k present on the HF channel is measured (in a way similar to steps 312 and 327, but with the distinct sampling delay now present), and the result of this measurement is stored in the array IPH at index 2k. At step 365, the value measured for H(k) during steps 312 or 327, less two times XT(k), is stored into the IPH array at index 2k+1. At step 368, the two newly filled array values IPH(2k) and IPH(2k+1) are added to Sum, for the purpose of the forthcoming normalization. At step 370, k is incremented, and at step 372, k is compared to N/2. If k is still smaller than N/2, there are other IPH array values left to be filled, and calibration proceeds again to step 362. Otherwise, IPH having been built, the execution proceeds to IPH normalization at step 380.

Beginning the normalization process, at step 380, array index variable k is set to $-N$. At step 385, the value of array IPH at index k is divided by Sum. At step 388, k is incremented by one, and at step 395, k is compared to N. If k is still smaller than N, execution continues again at step 385. Otherwise, the normalization of IPH having been completed, execution proceeds to step 398. At step 398, a visual (or automated) comparison is performed to verify that IPH is reasonably similar to $\sin(x)/x$ in shape. While this step might be skipped, it is mainly indicated as a principal "checkpoint" in the calibration. After calibration step 398, calibration proceeds to step 399, which states that calibration resumes at step 400, the first step on FIG. 6c.

Referring next to FIG. 6c, first, at step 400, the calibration initiated in FIG. 6b is resumed. Note that the hardware register controlling the delay of the synchronized impulse is still loaded with $d_{1M}$, maintaining conditions that yield a maximal DC response out of the HF channel. At step 405, the program variable $d_L$ is set to $d_{L0}$ plus half a sampling clock period (50 ps in the preferred embodiment). The calibration parameter $d_{L0}$ represents a default initial digitizer sampling, typically about 200 ps in the preferred embodiment. A loop variable "s", controlling the size of the steps of the binary search to be described below, is initialized to "$s_0$". A typical value of "$s_0$" might be 64 ps. Calibration steps 406-449 then represent a binary search for a delay value that provides "equilibrium" between the right hand side of the response, denoted by RHS, and the left hand side of the response, denoted by LHS.

Steps 406-435 perform the measurement and calculation of LHS and RHS, as will be described below. At step 438, the values of LHS and RHS are compared. If RHS is larger than LHS, indicating that the sampled waveform is too much on the "late" side, calibration proceeds to step 443, where the program variable $d_L$ controlling the sampling delay is increased by s. Otherwise, calibration proceeds to step 441, where the program variable $d_L$ is decreased by s. In either case, calibration then proceeds to step 445, where s is divided by 2. This means that the binary search will have twice the precision when (and if) it continues. At step 449, S is compared with $S_F$. The $S_F$ calibration parameter controls the precision of the adjustment and typically would have a value of 1 ps in the preferred embodiment. If S is still larger than $S_F$, calibration continues returning to step 406. If not, the adjustment of $d_L$ is complete and calibration continues with the evaluation and normalization of the tap coefficients IPL, at step 450.

The calculation of LHS and RHS takes place in steps 406-435, as note above. At step 406, the value of $d_L$ is loaded to the hardware register controlling the digitizer sampling delay on the LF channel. At step 407, to prepare for the evaluation of the sum of the left hand side and the sum of the right hand side, program variables LHS and RHS are initialized to zero, and the summation index k is initialized to $-N/2+1$. At step 412, the average response of the LF channel at index k, denoted by L(k), is measured (in a way similar to calibration step 218). At step 415, this measured value L(k) is added to LHS. Then, at step 418, the value of k is increased by 2. At step 422, it is tested whether k is still less than N/2. If so, additional evaluation of LHS is performed by continuing to return to step 412. Otherwise, execution proceeds to step 425, where k is initialized to −N/2 to cover the values skipped by the calculation of LHS. Then follows step 427, which like 412, performs the evaluation of the average response of the LF channel at index k, called L(k). At step 429, this measured value is added into RHS. At step 433, the value of k is increased by 2. At step 435, it is tested whether k is still lower than N/2. If so, additional evaluation of RHS is performed by continuing to return to step 427. Otherwise, execution proceeds to step 438, as the calculation of LHS and RHS are complete.

Following the adjustment of $d_L$, performed by steps 405-449 in the left side of FIG. 6c, additional calibration steps are performed on the right side of FIG. 6c. This calibration consist of steps 450-472, that build an array IPL of 2N values, and steps 480-499 that normalize and validate this array in preparation for its use as filter taps.

First, the building of the IPL array will be considered. At calibration step 450, $d_L$ is reduced by half a sampling clock period (50 ps in the exemplary preferred embodiment). At step 455, the hardware register controlling the sampling delay of the LF channel is loaded with this updated value of $d_L$. The purpose is to accomplish a virtual doubling of the sampling rate by interleaving samples. Then at step 457, the index variable k is initialized to −N/2. At step 462, the average value of the sample number k present on the LF channel is measured (in a way similar to steps 412 and 427, but with the distinct sampling delay now present, as expressed by the prime symbol in L'(k)), and the result of this measurement is stored in the array IPL at index 2k. At step 465, the value last measured for L(k) during steps 412 or 427 is stored into the IPL array at index 2k+1. At step 470, k is incremented by one, and at step 472, k is compared to N/2. If k is still smaller than N/2, there are IPL array values left to be filled, and calibration proceeds to step 462. Otherwise, IPL having been completed, the execution proceeds to IPL normalization at step 480.

Normalization of IPL consists of the following steps. At step 480, array index variable k is set to −N. At step 485, the value of array IPL at index k is divided by Sum. At step 488, k is incremented by one, and at step 495, k is compared to N. If k is still smaller than N, execution continues again at step 485. Otherwise, the normalization of IPL having been completed, execution proceeds to step 498. At step 498, a visual (or automated) comparison is performed to verify that IPL is reasonably similar to sin(x)/x in shape. While this step might be skipped, it is mainly indicated as a principal "checkpoint" in the calibration. After this check point, calibration proceeds to calibration step 499, where $d_L$ is reduced by half a sampling clock period (to achieve the equivalent delay adjustment of FIG. 3d), and at 500 the calibration is done. Note that with this final delay adjustment, we achieve "quadrature"—namely, for signals of frequency $f_S/2$, when the response in the "HF" channel is maximal, it will be minimal in the "LF" channel.

Figure 7:
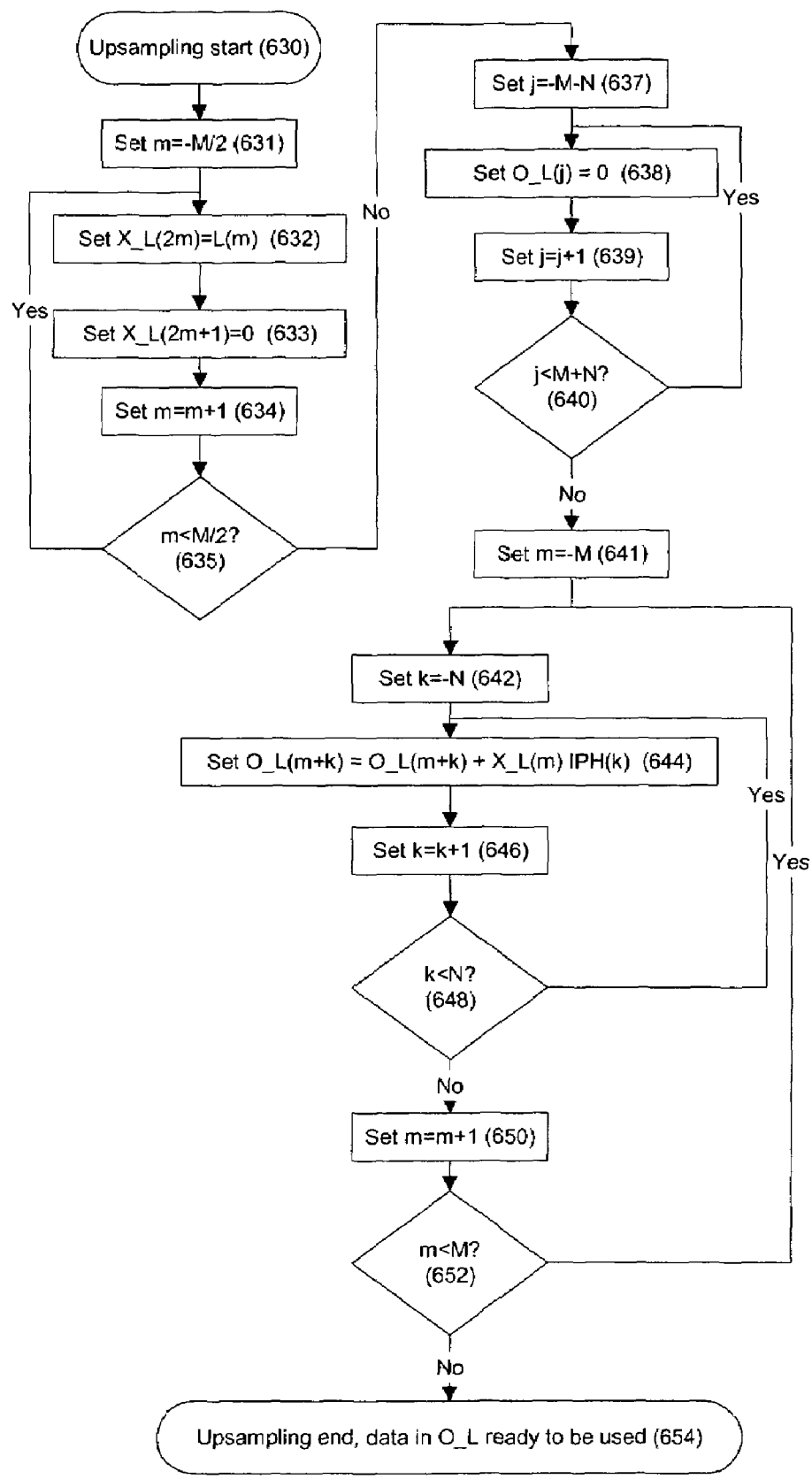
FIG. 7 is a flowchart diagram detailing the preferred functioning of an LF adaptive up sample filter (block 73 of FIG. 11)
Figure 8:
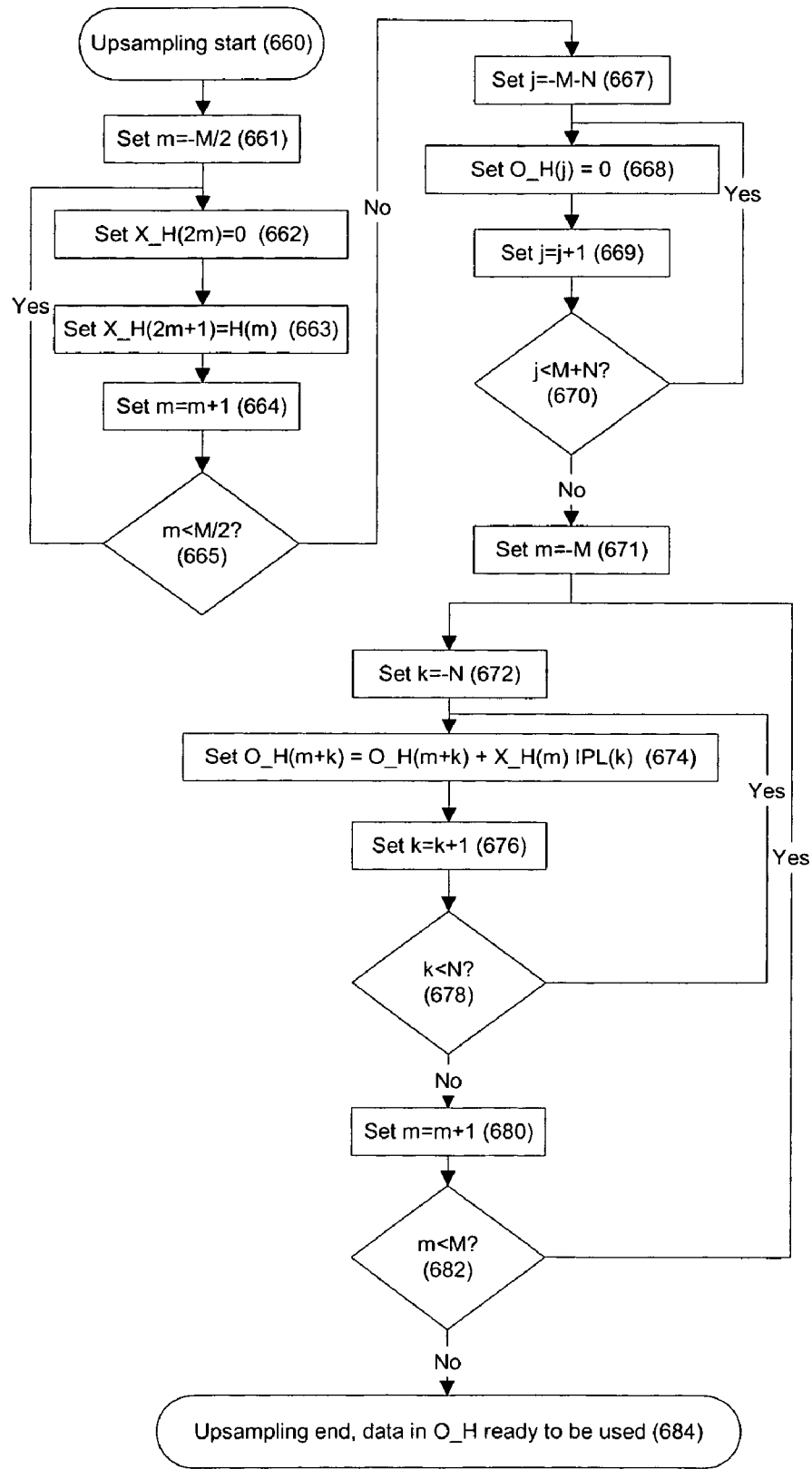
FIG. 8 is a flowchart diagram detailing the preferred functioning of a HF adaptive upsample filter (block 80 of FIG. 11)

Referring next to FIGS. 7 and 8, further processing in accordance with the invention will now be described. In the above-reference '075 application, both elements 73 and 80 of FIG. 10 were described as up sampling filters with fractional delay and filter taps being windowed Sinc functions up to a maximum sample distance, consistent with the published state of the art of such filters as per the references therein. In the present invention the windowed Sinc function is replaced by an appropriate set of numbers that are obtained during the calibration process described above. FIGS. 7 and 8 describe an algorithm for the calculation of the upsampled data (representing the contents of blocks 73 and 80 of FIG. 11 of the current invention). While this may not be the most efficient algorithm, since it could be simplified by eliminating some of the intermediate calculations, it does show accurately the values of the upsampled data. In particular, it would give exactly the same result as elements 73 and 80 of the '075 application if "IPH" and "IPL" were replaced by values of the "Sinc" function.

Figure 11:
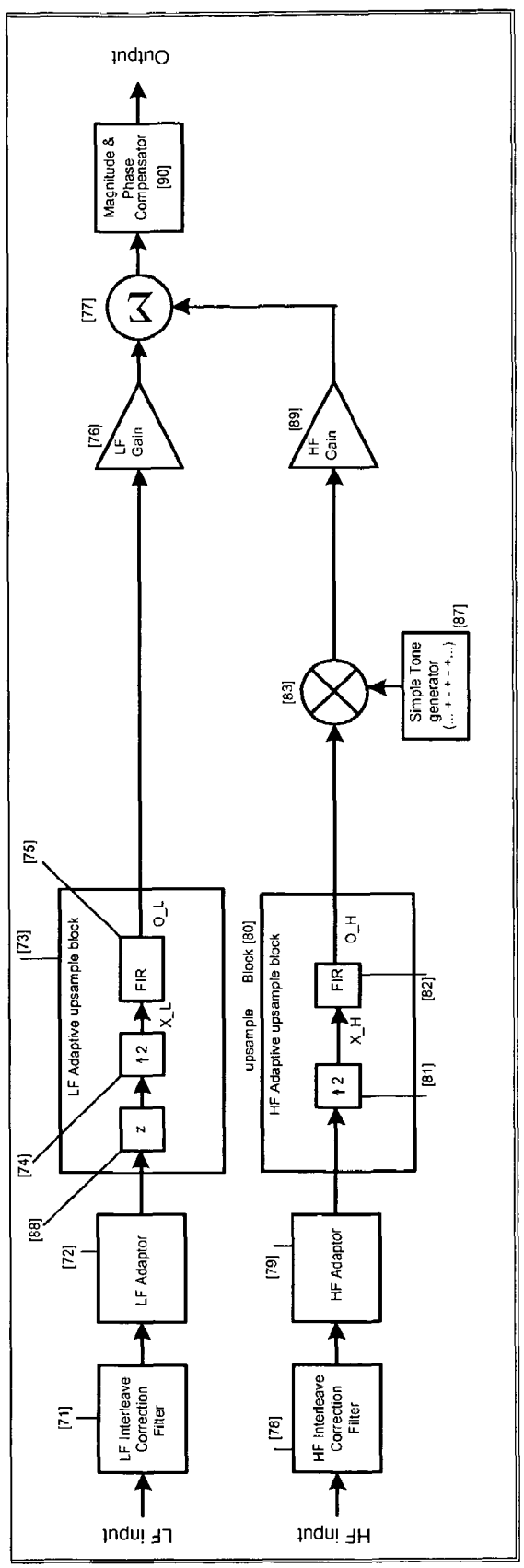
FIG. 11 is a block diagram depicting various software elements in accordance with a preferred embodiment of the present invention.

FIG. 7 depicts a flow chart for the calculation of the LF data (block 73 of FIG. 11 which is the replacement for element 73 of FIG. 10 in the '075 application), and FIG. 8 depicts a flow chart for the calculation of the HF data (block 80 of FIG. 11 which is the replacement for element 80 of FIG. 10 in the '075 application). To draw an analogy, in the limit where the values of IPL and IPH approach the Sinc function, the fractional delay of element 73 in the '075 application is set to one half (0.5) and the fractional delay of element 80 in the '075 application is set to zero.

Referring first to FIG. 7, the calculation of the LF up sampled data in an array O_L will be described. At step 630, the up sampling calculation is started. Program execution then proceeds to step 631 where index loop variable m is set to −M/2, where, like previously during calibration, M might typically be 10000 in a preferred embodiment, representing half the size of the data acquisition record to be processed. Then at step 632, an intermediate expansion array called X_L is loaded at index position 2m with the acquired $m^{th}$ data point L(m); at step 633, the next point of X_L, X_L(2m+1), is initialized to zero. Execution then proceeds to step 634 where m is incremented by 1. At step 635, m is compared with M. If m is smaller than M, execution returns back to step 632, making more of the acquired data array L to be expanded into X_L. Otherwise, if m is not smaller than M, the expansion part of the up sampling is complete and execution proceeds to step 637.

Steps 637-640 then initialize the output array in preparation for an FIR calculation. At step 637, index loop variable j is set to −M−N. N represents the same integer number of samples of finite impulse response as during calibration. At step 638, output array O_L is initialized to zero at index j. At step 639, the value of j is incremented by one. Then at step 640 the value of j is compared with M+N. If the value of j is still smaller than M+N, program execution returns to step 638 where more elements of O_L are initialized. Otherwise, if the value of j is not smaller than M+N, O_L initialization is complete and execution proceeds to step 641.

Steps 641-652 represent the numerical convolution, or FIR filtering, of the data. At step 641, an index loop variable m is set to −M. At step 642, an index loop variable k is set to −N. At step 644, the value of O_L at index m+k is incremented by the product of the expanded array X_L at element m by the value of the array IPH found during calibration at index k. At step 646, k is incremented by one, and at step 648 it is compared with N. If k is still smaller than N, execution goes to step 644, continuing the FIR calculation. Otherwise, if k is not smaller than N, execution proceeds to step 650, where m is incremented by one. At step 652, m is compared with M. If m is still smaller than M, execution proceeds to step 642, where the next acquisition point goes through the FIR. Otherwise, if m is not smaller than M, execution proceeds to step 654, where the calculation of all O_L is completed. Note that only elements from −M+N to M−N of O_L are valid complete FIR calculations, and this is taken care by the evaluation of a correct number of startup samples; when an acquisition of 2M points is requested, the number of actually acquired points is set to 2M+4N in the acquisition hardware. This technique of adding startup samples is the same used in the '075 application.

Referring next to FIG. 8, the calculation of the HF up sampled data in an array O_H will be described. At step 660, the up sampling calculation is started. Processing then proceeds to step 661 where index loop variable m is set to −M/2. Then at step 662, an intermediate expansion array called X_H is loaded at index position 2m with zero; at step 663, the next point of X_H, X_H(2m+1), is set to the acquired $m^{th}$ data point H(m). Processing then proceeds to step 664 where m is incremented by 1. At step 665, m is compared with M. If m is smaller than M, execution returns to step 662, expanding more of the acquired data array H into X_H. Otherwise, if m is not smaller than M, the expansion part of the up sampling is complete and execution proceeds to step 667.

Steps 667-670 initialize the output array in preparation for the FIR calculation. At step 667, index loop variable j is set to −M−N. At step 668, output array O_H is initialized to zero at index j. At step 669, the value of j is incremented by one. Then at step 670 the value of j is compared with M+N. If the value of j is still smaller than M+N, program execution returns to step 668 where more elements of O_H are initialized. Otherwise, if the value of j is not smaller than M+N, O_H initialization is complete and execution proceeds to step 671.

Steps 671-682 represent the numerical convolution, or FIR filtering, of the data. At step 671, an index loop variable m is set to −M. At step 672, an index loop variable k is set to −N. At step 674, the value of O_H at index m+k is incremented by the product of the expanded array X_H at element m by the value of the array IPL found during calibration at index k. At step 676, k is incremented by one, and at step 678 k is compared with N. If k is still smaller than N, execution proceeds to step 674, continuing the FIR calculation, Otherwise, if k is not smaller than N, execution proceeds to step 680, where m is incremented by one. At step 682, m is compared with M. If m is still smaller than M, execution proceeds to step 672, where the next acquisition point goes through the FIR. Otherwise, if m is not smaller than M, execution proceeds to step 684, where the calculation of all O_H is completed. Note that only elements form −M+N to M−N of O_H are valid complete FIR calculations (like with the LF upsampler), so N startup samples are necessary.

Figure 9:
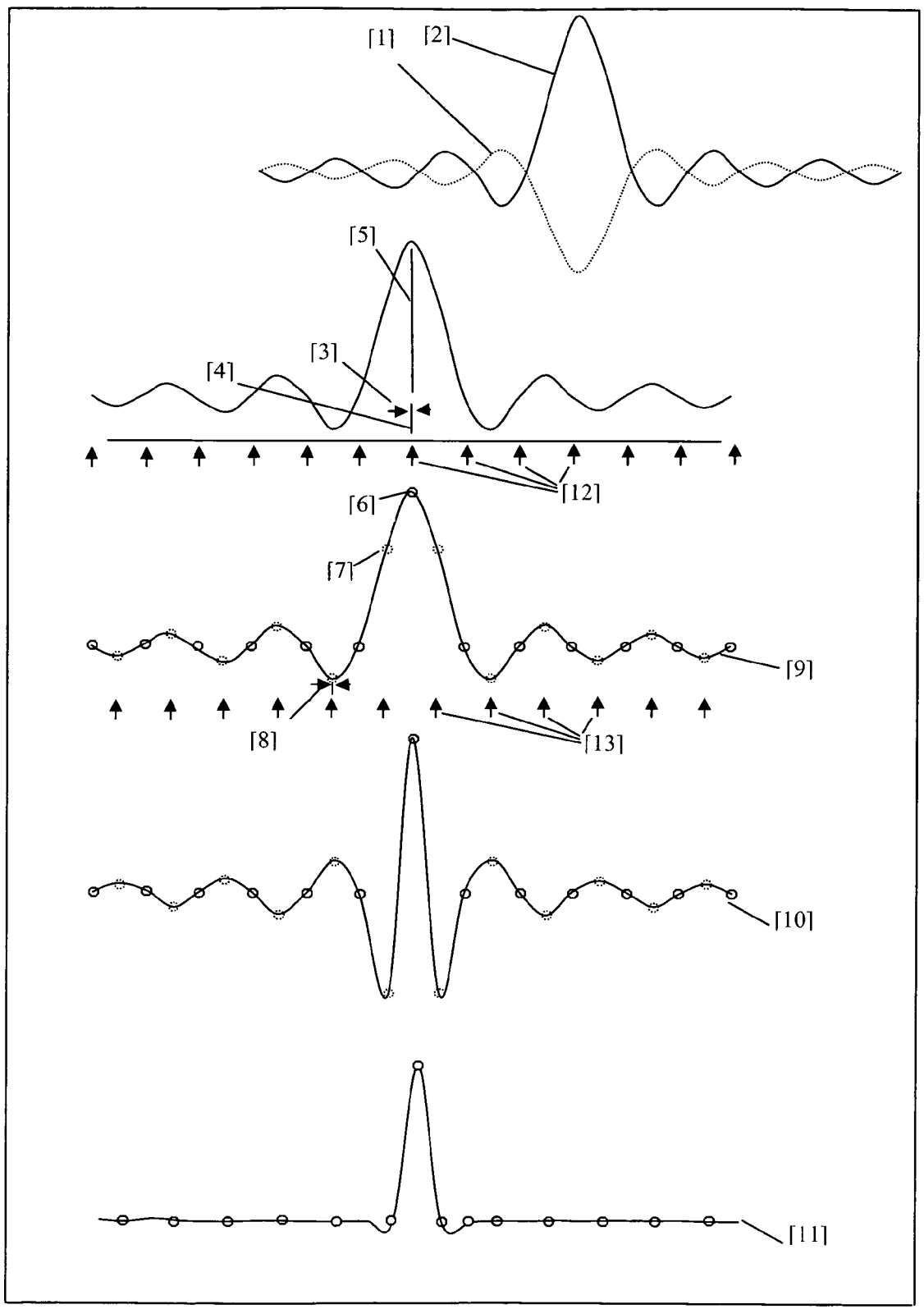
FIG. 9 is a graphical representation of an impulse response during various steps of a time-domain calibration process in the simplified case of flat group delay and the appearance of a brief impulse, such as the calibration pulse itself, on the instrument calibrated in accordance with an embodiment of the present invention.

Referring next to FIG. 9, an approximate graphical representation of an impulse response employed during various steps of a calibration process for calibrating an oscilloscope in accordance with the invention is shown. This is meant as a visual guide to the processes occurring during and after the calibration we have just described, and does not imply that the points will be in the precise positions shown. A brief positive impulse is fed to an input of a DBI oscilloscope (for example, element 27 of FIG. 10 below). Firstly, signal 1 shows the voltage as a function of time at the output of a HF channel (element 63 of FIG. 10 below). Note that despite the fact that the calibration pulse is positive, this voltage is negative; this represents a typical voltage as a function of time before the calibration pulse timing is adjusted by varying the variable delay (represented by element 703 of FIG. 5 above). Whether the voltage of this signal 1 is mostly positive or mostly negative, and how large the voltage is, depends on the phase relationship between the impulse present at the RF node of the mixer and the sinusoidal signal at the LO node of the mixer. During a calibration process (calibration steps of FIG. 6a above), the timing of this calibration pulse is aligned (by varying the aforementioned variable delay) to determine a maximum positive response signal 2. Calibration continues, and a sampling delay 3 is adjusted so that a sample point 4, of a plurality of sample points 12, is positioned at a center point 5 of the maximum positive response 2 (see the calibration steps of FIG. 6b above). A set of samples is taken at these points 12. Next, new samples 7 (at sample points 13) are taken approximately half way between the originally taken samples noted at 6 (taken at sample points 12). The interleaving of samples 6 and 7 represents the calibrated impulse input response of the HF channel, "IPH".

The impulse response of the LF channel has approximately the same shape (sin(x)/x shape) as the HF channel response, but will have in general some small differences, which are not represented here. Again (see the calibration steps of FIG. 6c above), the sample delay is adjusted so that, at the center of the wavelet, a set of points 6 is taken, and a set of half-way points 7 is then taken, and they collectively represent the calibrated impulse input response of the LF channel, "IPL".

The sampling delay 8 of the low frequency channel is readjusted (see the calibrations steps of FIGS. 6e and 6f above) so that the sampling points 13 for the low frequency channel are positioned half-way between those (12) for the high frequency channel. The fact that the LF channel and HF channel are sampling differently is a very important part of this invention.

The operation of this invention (after completion of calibration) could be illustrated several ways. One could provide a sweep frequency chirp signal, a step, or any other signal shape available. One particularly simple way to illustrate the operation of this invention is to provide the same signal that was used during calibration, at the timing that provides the maximum positive response 2. Supposing such as signal is provided to such a calibrated apparatus, the response of the high frequency channel and the response of the low frequency channel have again the same shape 9. The high frequency channel signal is again acquired at centered sampling positions (12) that yield a set of points (6), and the low frequency channel signal is again acquired at offset-by-a-half sampling positions (13) that yield a distinct set of points (7). Then, during a first phase of processing (elements 73 and 80 of FIG. 11 below), points approximately like 7 are interpolated from the original points of the high frequency channel waveform 6, and points approximately like 6 are interpolated from the original points of the low frequency channel waveform 7. Then, the sign of the interpolated points on the high frequency channel signal is flipped, yielding a new waveform 10, which has approximately the shape of sin(2x)/x−sin(x)/x. Finally, 9 and 10 are summed together, yielding a new waveform with double bandwidth 1, and having the shape of sin(2x)/x. When other signals are applied, the bandwidth is similarly doubled.

In summary, the timing of the idealized case illustrated by FIG. 9 can be confirmed in the following way. The adjustments of FIG. 6a line up the short impulse pulse with the center of a positive lobe of LO. The adjustment of FIG. 6b then adjusts the sampling point until it matches the mixing clock, as far as the HF channel is concerned (sampling in the middle of the positive lobes of LO). The LF sampling point is similarly lined up (adjustment of FIG. 6c), but shifted by ½$f_S$, putting it a quarter of cycle of $f_S$/2 ahead of the HF. When it is used, however, it is used with a fractional delay equivalent to half a sample, compensating the fact that it was sampled "too early". Both parts of the pulse thus arrive "at the same time".

FIG. 10 shows a block diagram depicting the DBI hardware. The block diagram shows a single DBI channel combining the bandwidth of channels 1 and 2. Only these channels are discussed here to explain the invention. It is contemplated to duplicate that hardware as in FIG. 2 of the '075 application, and the addition of various relays to switch in and out of DBI operation as in the '075 application may be employed; however these enhancements are not necessary to explain or implement the present invention.

In FIG. 10, the channel 2 input [27] enters a diplexer [29] which splits the signal into two frequency bands. The DC to 5 GHz band [31] exits the diplexer then continues directly to scope front end channel 2 [32], which is referred to as the LF channel. The HF signal path is more complicated and will now be described in detail. The HF band from 5 to 10 GHz, upon exiting the diplexer [33], enters a specially designed attenuator [34] that may perform some BW filtering to improve the frequency response near the crossover frequencies of the diplexer, thus serving to flatten the HF band. The HF band then enters a variable attenuator [35], designed to provide from 1 to 41 dB of attenuation. Then, the HF band enters a variable gain amplifier (VGA) [36] designed to provide from 13 to 24 dB of gain. Both the variable attenuator [35] and VGA [36] are designed to provide an overall amount of gain/attenuation to fix the VGA maximum output power at a constant level corresponding to a full-scale signal on the screen of the DSO at the Volt/div (vdiv) setting specified by the scope user.

The output of the VGA [36] passes to another band pass filter [37], through a 3 dB pad [38] and into the radio frequency (RF) input [39] of a mixer [40] at a maximum level of −14.48 dBm. Since high frequency mixers tend to have poor isolation between the RF input [39] and the intermediate frequency (IF) output [42], the band pass filter [37] is provided to sharply limit the frequency content to between 5 and 10 GHz. The RF-IF isolation of the mixer is typically −20 dB. This means that any signal entering the mixer RF input [39] can appear at the IF output [42] at the same frequency, but attenuated by only 20 dB. This is the origin of the crosstalk discussed in FIG. 3e and in the flowcharts of FIG. 6 above.

The mixer local oscillator (LO) input [41] originates from an amplifier that tracks a copy the 10 GHz sampling clock of the DSO at an output power of 21 dBm. This copy is obtained by a directional coupler picking the main clock of the DSO. The LO enters the mixer LO input and mixes with the 5 to 10 GHz band present at the mixer RF input [39]. The result at the mixer IF output [42] is two images of the 5 to 10 GHz band. The low frequency image appears in a band from DC to 5 GHz and is reversed in frequency. In other words, 6 GHz at the mixer RF input appears at 4 GHz at the IF output and 9.5 GHz at the mixer RF input appears at 500 MHz at the IF output. The high frequency image appears in a band from 15 GHz and 20 GHz. In addition to these two bands, because of possible poor LO-IF isolation, there is also a large amount of 10 GHz leakage from the LO input [41] present at the mixer IF output [42]. The LO leakage power is about 0 dBm. Also, there is a sizeable amount of leakage from the RF input into the IF. In the context of this invention, this leakage is called crosstalk because it is as if signal intended for the LF path arrived into the HF path.

The mixer IF output [42] passes through a 3 dB pad [50] and enters an image reject low pass filter [51] that rejects the high frequency image along with the 10 GHz LO leakage. The output of the low pass filter [51] passes to a fixed gain amplifier (FGA) [52] that amplifies the signal to approximately −4 dB maximum output power. To achieve the full bandwidth of 10 GHz (or $f_S$ in general), it is preferable that this amplifier can operate DC amplification. If not, the bandwidth is reduced, and more importantly, the frequency-domain calibration described below in FIG. 14 would have to be employed in place of the time-domain calibration of FIGS. 6a-6c, because otherwise "Sum" of FIG. 6b would approach zero, and division by zero would result.

FIG. 11 shows a block diagram of the digital system (typically implemented in software) utilized to process a single DBI channel, analogous to FIG. 10 of the '075 application. The path begins with the LF and HF signals entering the LF Interleave correction filter [71] and the HF Interleave correction filter [78] respectively. These filters [71,78] are described in Mueller, et al., U.S. patent application Ser. No. 11/280,493, entitled Method and Apparatus for Artifact Signal Reduction in Systems of Mismatched Interleaved Digitizers, currently pending, the contents thereof being incorporated herein by reference. Then adapters [72] and [79] make sure that the signals are arriving nearly at the same time via the LF and HF channels by shifting the data acquisition records by an integer number of samples. The LF band then enters a LF adaptive upsampler block [73] (including a one-half fractional delay [88], a pure upsampler [74], and a FIR filter [75], the whole block being described in detail in FIG. 7), a scaling element [76] and then a summing node [77]. For its part, the HF band enters a HF adaptive upsampler block [80] (consisting of a pure upsampler [81] followed by a FIR filter, described in more detail in FIG. 8), then a stage of multiplication with a tone [83]. A tone generator [87] simply calculates a sinewave of frequency $f_S$ sampled at $2 f_S$, namely +1 on even samples and −1 on odd samples. A gain stage follows, to set the voltage scale of the HF channel to match the voltage scale of the LF channel [89]. Finally, the HF band enters summing node [77]. Before it is used to display acquired waveforms, the reconstructed signal is filtered [90] as already described the '075 application to flatten the frequency and group delay responses.

Figure 12:
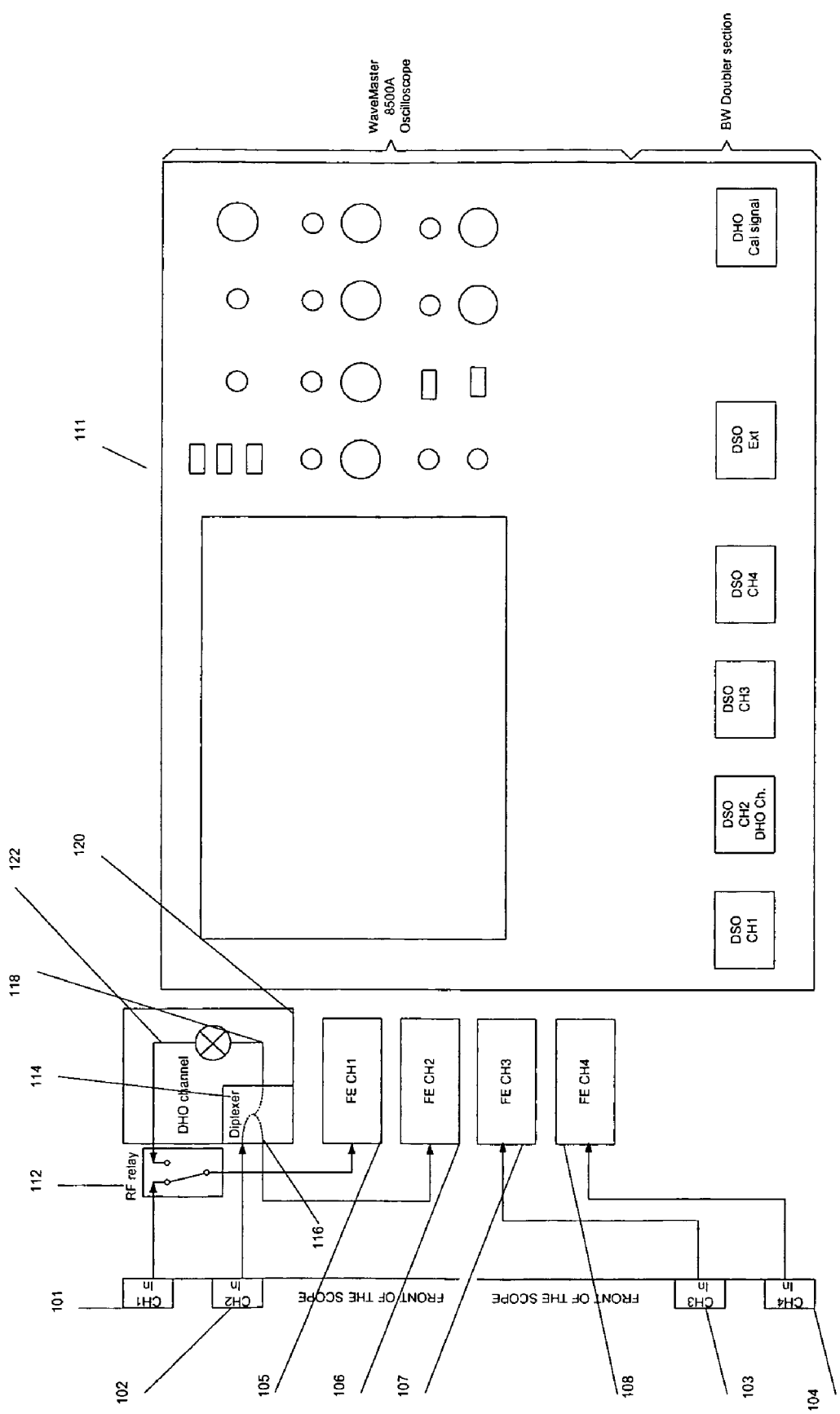
FIG. 12 is a block diagram showing how the inputs and DBI hardware outputs are connected to the scope front-end in accordance with a preferred embodiment of the present invention.

FIG. 12 shows a block diagram of a DBI enabled scope, in particular a one channel DBI implementation. In this implementation, channels 1 [101] and 2 [102] are grouped together as a DBI channel. Channels 3 [103] and 4 [104] are left untouched, connected simply to scope front-end 3 [107] and scope front-end 4 [108].

Channels 2 [102] is connected to DBI diplexer [114] input. Channel 1 [101] is connected to an RF relay [112]. The diplexer [114] serves to separate the input spectrum into two frequency bands. Preferably one band is from DC to 5 GHz and the other band is from 5 GHz to 10 GHz. The band from DC to 5 GHz exits the diplexer LF band output [116] and is connected directly to scope front-end 2 [106]. In this manner, scope front-end 2 [106] receives the band limited input of channel 2 [102]. The frequency band from 5 to 10 GHz exits the diplexer HF output [118] and enters the DBI channel input [120]. Between the input [120] and output [122] the DBI channel frequency translates the 5 to 10 GHz band down to DC to 5 GHz. The frequency translated output [122] is connected to the RF relay [112]. The RF relay, having three terminals, is connected to a scope channel input 1 [101], a DBI frequency translated band output [122], and a scope front-end 1 [105]. In the normal relay setting, scope channel 1 [101] is connected to the scope front-end 1 [105] and since front-end 2 [106] receives the DC-S GHz portion of channel input [102], it can be seen that the scope operates as it would without the DBI circuitry addition. In other words, in the normal relay setting, each scope front-end receives an input from its corresponding channel input, and the scope being a LeCroy WaveMaster 8500A [1011], it can acquire four channels at 10 GS/s with 5 GHz of bandwidth into up to 24 Mpoints.

In the other relay setting, channel 1 [101] is disabled and front-ends 1 [105] and 2 [106] are utilized together to perform DBI acquisitions of the input applied to channel 2 [102]. Considering DBI channel 2 operating in DBI mode, the DC to 5 GHz band is provided to scope front-end 2. This band is designated as the low-frequency band or LF band and the path from the channel 2 input through the system is referred to as the LF path. The band from 5 to 10 GHz output from the diplexer passes through the DBI circuitry and is eventually connected to scope front-end 1 through the RF relay. This band is referred to as the HF band and its path through the system is called the HF path. This arrangement of two channels into a DBI channel can be repeated, in a generalization of the preferred embodiment of this invention, on channels 3 and 4, as was performed in the '075 application. Another generalization would consist of splitting the signal into four frequency bands, three of which would be shifted in frequency (LF band, DC-5 GHz not shifted; MF band, 5-10 GHz, low-image downconverted from 10 GHz; HF band, 10-15 GHz, high-image downconverted by 10 GHz; and VF band, low-image downconverted from 20 GHz). LF and MF would be combined just like LF and HF in the present invention. The result would be called LFMF. HF would be combined with VF like HF is combined to LF in the present invention. The result would be called VFHF, and would appear like a 10 GHz signal low-image downconverted from 20 GHz. Then finally, VFHF would be combined with LFMF just like HF is combined to LF in the present invention. Such a binary-tree cascaded adaptive upsampling could similarly be done with LO frequencies of 10, 20, 30 and 40 GHz to convert eight 5 GHz, 10 GS/s channels into a single 40 GHz channel. The process of this invention would thus be applied to the interface between two frequency bands repeatedly to multiply the bandwidth by repeated factors of two by combining together $2^N$ channels in a binary tree arrangement shown in FIG. 13 below.

Figure 13:
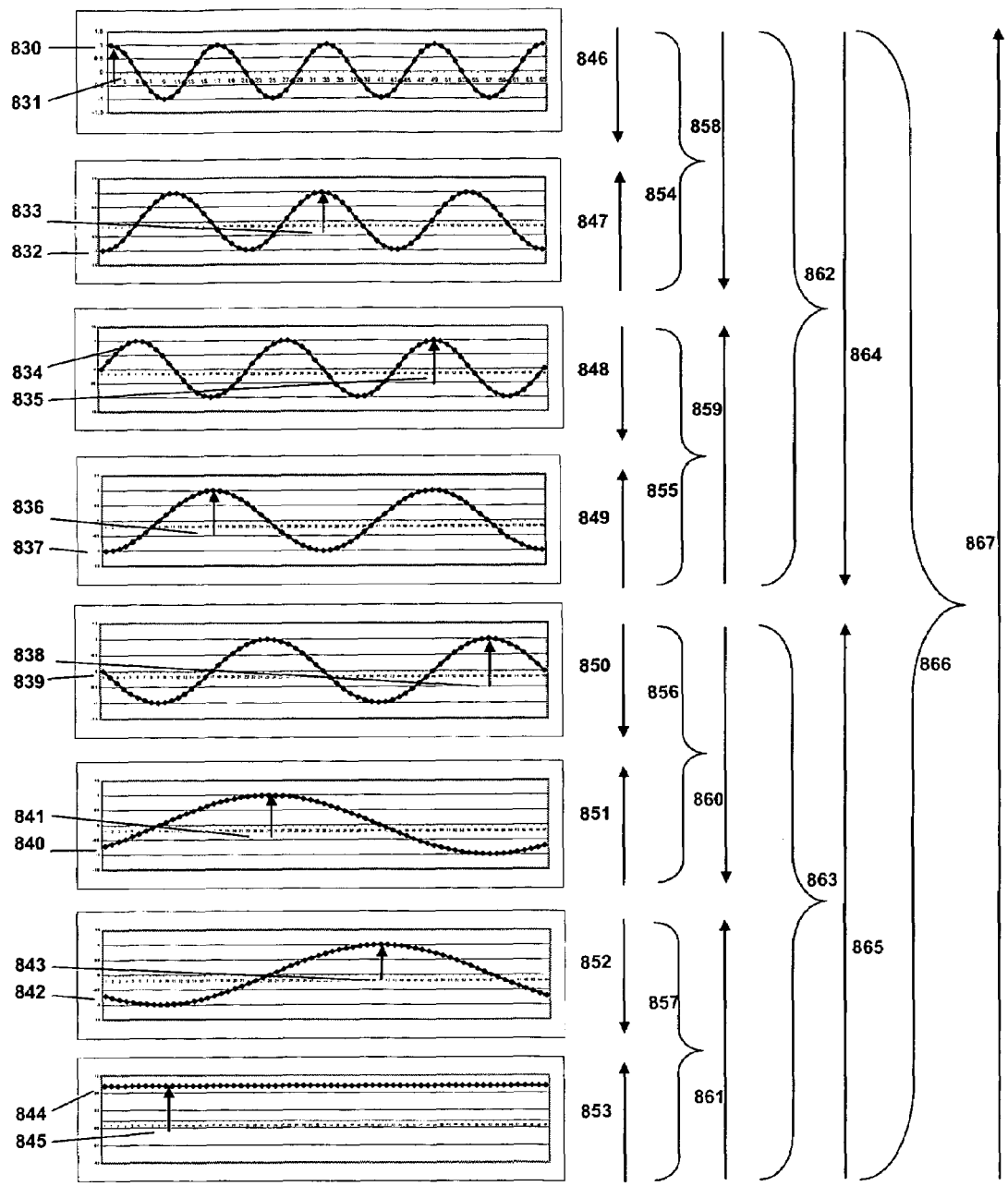
FIG. 13 depicts the desired arrangement of the bands and LO and sampling clock timings in a preferred cascaded usage of the present invention.

FIG. 13 illustrates an exemplary case of LO frequencies of 10, 20, 30, and 40 GHz used to convert eight channels of DBI to show the timing relationships that are preferably maintained in order to use adaptive interpolation/upsampling repeatedly. Of course, between two and any number of channels may be combined in accordance with the invention. A 40 GHz sinewave 830 is displayed, and for the sub-channel that uses this as a LO, the sampling occurs at arrow 831. Trace 832 shows a 30 GHz sinewave, which downconverts the 30-35 GHz band, and this result is sampled at arrow 833. Trace 834 shows a distinct 30 GHz sinewave, which downconverts the 25-30 GHz band, and is sampled at the time indicated by arrow 835. Note that 832 and 834 are in quadrature.

Next 836 shows a 20 GHz sinewave, which downconverts the 20-25 GHz band, and this result is sampled at arrow 837. Trace 838 shows a distinct 20 GHz sinewave, which downconverts the 15-20 GHz band, and is sampled at the location of arrow 839. Note that 836 and 838 are also in quadrature. Then, similarly, 840 shows a 10 GHz sinewave, which downconverts the 10-15 GHz band, and this result is sampled at arrow 841. Trace 842 shows a distinct 10 GHz sinewave, which downconverts the 5-10 GHz band, and is sampled at the location of arrow 843. Note that, again, 840 and 842 are in quadrature. Finally, 844 shows a unity constant—to represent the fact that the DC-5 GHz band is not downconverted (just multiplied by unity), and the point where this lowest frequency band is sampled is indicated by arrow 845.

Four bands are down-side down converted (846, 848, 850 and 852), while three bands are up-side downconverted (847, 849 and 851), and one band, DC-5 GHz, stays untouched (853). The direction of the arrow next to the band representations recalls how the frequency seen by the sub channel varies with the input frequency. At 854, adaptive interpolation/upsampling, in accordance with the invention as noted above, creates a signal 858 for the 30-40 GHz band (which is frequency reversed) by combining two bands as per the present invention, with 846 acting as "LF" and 847 acting as "HF". At 855, similarly, adaptive interpolation/upsampling creates a signal 859 for the 20-30 GHz band (which is not frequency reversed) by combining two bands as per the present invention, with 849 acting as "LF" and 848 acting as "HF". At 856, adaptive interpolation/upsampling creates a signal 860 for the 10-20 GHz band (this signal is frequency reversed) by combining two bands as per the present invention, with 850 acting as "LF" and 851 acting as "HF". At 857, adaptive interpolation/upsampling creates a signal 861 for the DC-10 GHz band (this signal is not frequency reversed) by combining two bands as per the present invention, with 853 acting as "LF" and 852 acting as "HF".

At 862, adaptive interpolation/upsampling creates a signal 864 for the 20-40 GHz band (this signal is frequency reversed) by combining two of the created bands as per the present invention, with 858 acting as "LF" and 859 acting as "HF". At 863, adaptive interpolation/upsampling creates a signal 865 for the DC-20 GHz band (this signal is not frequency reversed) by combining two of the created bands as per the present invention, with 861 acting as "LF" and 860 acting as "HF".

Finally, at 866, adaptive interpolation/upsampling creates a signal 867 for the DC-40 GHz band (this complete signal is not frequency reversed) by combining two of the created bands as per the present invention, with 865 acting as "LF" and 864 acting as "HF".

Actually, FIG. 13 illustrates a case N=3 of a general arrangement to meet the quadrature condition at all $2^N-1$ stitches of the bandwidth interleaving of $2^N$ bands. The sample point for band number k, where $0<=k<=2^N-1$ is located at time $j/(2^N f_S)$, where j has the reverse sequence of digits from k when k is written as a binary number, and the LO sinewave of frequency $floor((k+1)/2) f_S$ is phase adjusted to have a positive peak at the sample point. When choosing the sampling points in this drawing, it was assumed idealistically that the response of each channel was more or less symmetric around each of the sampling points, which would not necessarily be the case with real-world amplifiers. In reality, we should be applying the calibration steps of either FIG. 6 or FIG. 14, repeatedly, starting with the joining of individual bands by pairs, and working up to the full channel response. Only one detail has to be modified: in the adjustments that do not deal with individual bands, the steps changing either $d_H$ or $d_L$ have to be skipped. The impulse positioning (for the case of the calibration described by FIGS. 6a-6c), the building of the impulse response and its normalization method remain, the data points simply originating from pre-compensation combined channels instead of raw acquired channels. The quadrature between combined bands does not depend on sampling point timing but on adequate hardware design.

FIG. 14 describes alternative frequency-domain calibration steps, as noted above. It can replace the time-domain calibration of FIGS. 6a, 6b, 6c to achieve the adaptive upsampling. The usage steps (block 802 of FIG. 4) remain the same. At step 1200, this calibration is started. At step 1201, a sinusoidal voltage source of frequency $f_S/2$ and amplitude equal to the full scale of the DBI oscilloscope is applied to the DBI oscilloscope input. At step 1202, after setting $d_H$ and $d_L$ to their default, center-of-range values, the phase of the sinewave as seen by the HF channel is compared to phase of the sinewave as seen by the LF channel. Optimal instrument performance results if this phase difference is 90 degrees. At step 1203, any extra delay needed to achieve this phase difference condition, $(\pi/2\text{-phaseHFwrtLF})/(2\pi(f_S/2))$ is added to $d_H$. At step 1204, a loop index variable k is set to −N, where N represents the number of frequencies used to generate a good representation of the filtering occurring in the diplexer and DSO front-end hardware. A typical value of N is 32. Then, at step 1205, the frequency $f_{IN}$ to which the generator is to be set is calculated as k times Δf plus $f_S/2$, where the frequency step might typically be 62.5 MHz. Then at step 1207, after this frequency is programmed in the sinusoidal signal generator, the response (either at $f_{IN}$ or $f_S/2f_{IN}$) is measured in both the LF and HF channel are measured, and these responses are compared in both amplitude and phase, yielding two numbers that are stored in the arrays amplHFwrtLF and phaseHFwrtLF at index k. At step 1210, loop index variable k is incremented by 1. At step 1212, this index is compared to the maximum value N. If it is greater than N, execution proceeds to step 1215 where the frequency-domain adaptive sampling will be built. Otherwise, the measurement loop continues and returns to step 1205.

At step 1215, a normalization constant norm is calculated as the ratio of amplitudes at Nyquist, which is stored (in the form of the inverse) in the array amplHFwrtLF at index 0. This variable is useful in further processing when the gain of the HF channel is not very well adjusted to the gain of the LF channel. The loop index variable k is reset to −M, M being the length of the intended FIR taps array. Typically, M could be equal to 128. Then, at step 1217, the absolute value of this loop index variable is compared to M/2. If this absolute value is smaller, execution proceeds to step 1220, where arrays $IPH_{FD}$ and $IPL_{FD}$ are set to 1 and norm respectively. Execution then proceeds at index k. Otherwise, if |k| is larger than M/2, execution proceed to step 1222, where it is compared to M/2+N. If it is again larger, both arrays $IPH_{FD}$ and $IPL_{FD}$ are set to 0 at index k, and execution proceeds to step 1230. Otherwise, at step 1227, $IPH_{FD}$ is set to amplHFwrtLF(M/2−|k|) exp(i (phaseHFwrtLF(M/2−|k|)−π/2)*sign(k)) times norm at index k, and $IPH_{FD}$ is set to 1/(amplHFwr tLF(|k|−M/2) exp(i (phaseHFwrtLF(|k|−M/2)−π/2)*sign(k))) at index k. The dependency on the sign of k is to ensure symmetry so that when the IFFT is taken the result is real.

Then at step 1230, the array and loop index variable k is incremented by 1, and at step 1232, it is checked whether this index variable k is less than M. If is less, the building of $IPH_{FD}$ and $IPL_{FD}$ from the measurements can continue at step 1217. Otherwise, execution proceeds to step 1235, where $IPH_{FD}$ and $IPL_{FD}$ are IFFT'd in arrays IPL and IPH. At step 1240, the calibration is complete. The calibration set consisting of IPL, IPH, $d_H$ and $d_L$ is stored for usage in the scope, as shown above (element 808 of FIG. 4).

Figure 15A:
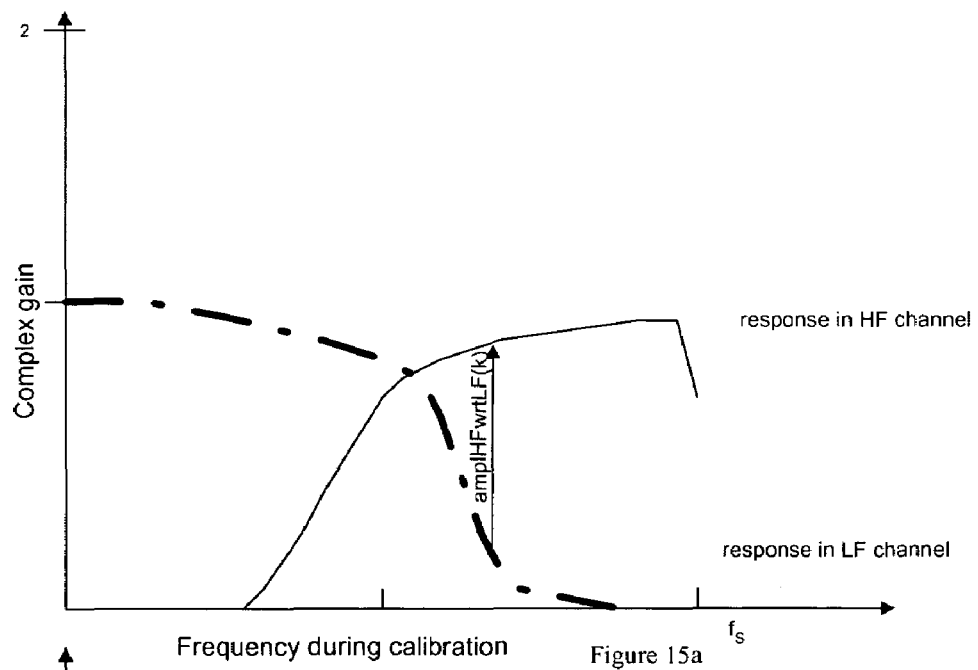
FIG. 15 shows symbolic graphs of the Fourier transform of the response of the hardware as a function of frequency in the "LF" and "HF" channels (upper part), of their ratio (middle part), and Fourier transform of the filter taps (bottom part) that maintain this ratio.
Figure 15B:
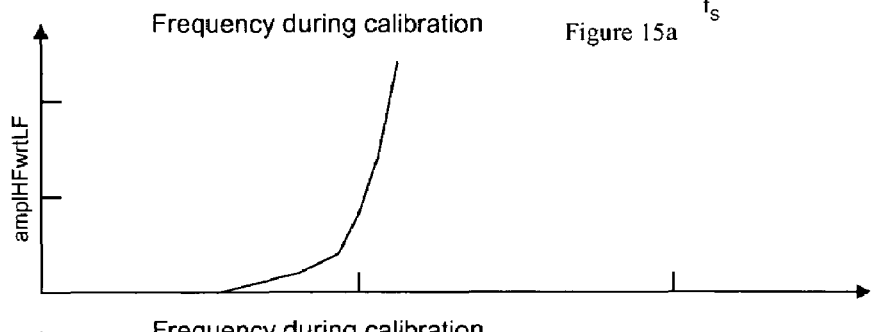
Figure 15C:
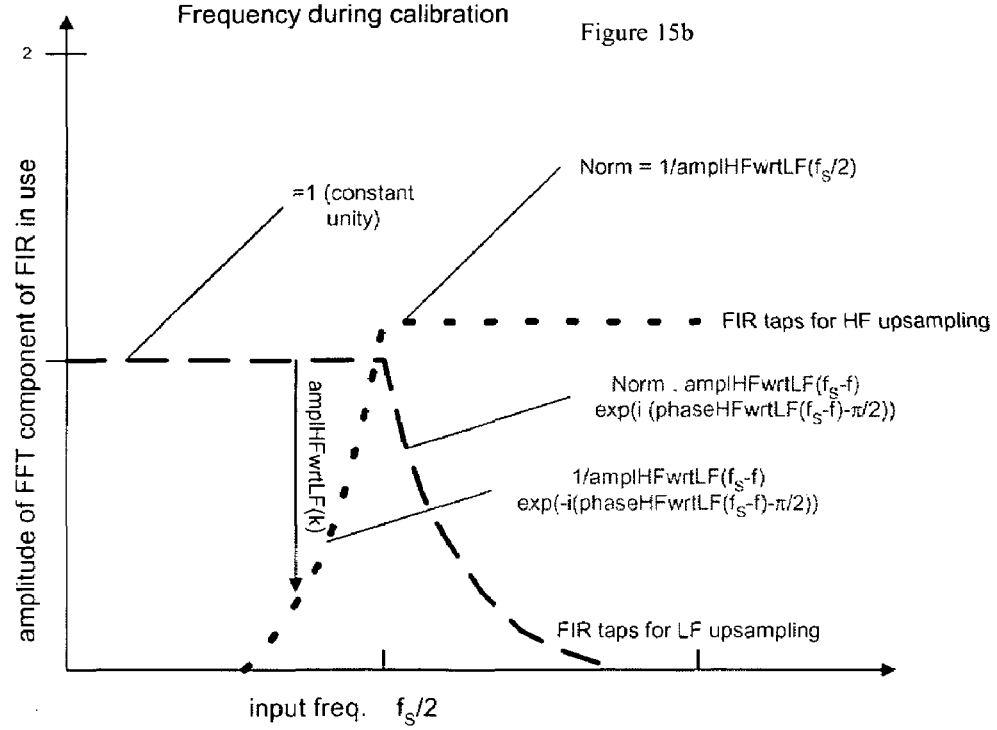

FIGS. 15a-15c depict the process of calibration described in FIG. 14, in particular how the ratio existing between two continuously varying (non-flat) functions can be maintained by two distinct curves that are flat in exclusive regions. It is important that this ratio be maintained because maintaining this ratio equates to maintaining the Schniter condition noted above. In the upper graph, FIG. 15a, the gain of the channels as a function of frequency is represented. This gain is in general a complex number but here it is represented as a positive number for the sake of being able to visualize the variation of these gains with frequency. At a given frequency (index "k" in FIG. 14), a vertical arrow represent the ratio of the gain of the HF channel with respect to the LF channel. In the lower graph (FIG. 15c), the gain of the FIR part of the upsampling filters, for LF and HF, as a function of frequency, is represented. The same vertical arrow, at the mirror index M/2−|k|, indicates the same ratio of gain. The evolution of this ratio with frequency is represented in the middle graph (FIG. 15b). The building of the flat parts of these curves is performed during step 1220 of the calibration shown in FIG. 14. Far enough from $f_S/2$, the log ratio between the curves is so large that either the ratio or its inverse can be approximated by zero, as it is done in step 1225 of FIG. 14. The flat parts are very important to handle the case where the HF response goes to zero near $f_S$.

Regarding the question of RF to IF leakage (crosstalk) and the frequency-domain calibration, this effect has been neglected in the calibration described by FIG. 14. However, just as with the time-domain method, one can easily identify the part of the response of the HF channel which is due to this leakage. The amplitude of LO can be set to zero by switching off the amplifier that provides LO, or averaging in a condition where LO is desynchronized from the sampling clock can be used. Having identified this cross-talk contribution, it can be scaled with respect to LF, and then amplHFwrtLF and phaseHFwrtLF may be corrected by complex subtraction of amplXTwrtLF and phaseXTwrtLF. But, as noted previously, the effects of the cross-talk during usage should also be removed, in addition to identifying and subtracting the component of the HF response due to this crosstalk during calibration. So, a frequency-reversed version of crosstalk is preferably added back. This is achieved by changing the formulae for $IPH_{FD}$ from amplHFwrtLF(M/2−|k|)exp(i(phaseHFwrtLF(M/2−|k|)−π/2)*sign(k))norm to

[amplHFwrtLF(M/2−|k|)exp(i(phaseHFwrtLF(M/2−|k|)−π/2)*sign(k))

+amplXTwrtLF(|k|−M/2)exp(i(phaseXTwrtLF(|k|−M/2)−π/2)*sign(k))]norm and $IPL_{FD}$ from 1/amplHFwrtLF(|k|−M/2)exp(−i(phaseHFwrtLF(|k|−M/2)−π/2)*sign(k))

to

1/[amplHFwrtLF(|k|−M/2)exp(−i(phaseHFwrtLF(|k|−M/2)−π/2)*sign(k))

+amplXTwrtLF(M/2−|k|)exp(−i(phaseXTwrtLF(M/2−|k|)−π/2)*sign(k))]

which is essentially equivalent to adding the frequency-reversed crosstalk to the HF response as this particular method of subtraction adds back frequency reversed crossover components for the purpose of a more exact offset of any existing spurs.

A further generalization of this method would be to construct other interpolating functions whose ratio as a function of frequency matches the ratio of the HF channel complex frequency response to the LF channel frequency response. The list of choices is too vast to cover them all in this disclosure, but all are intended to be considered embodiments of the present invention. In all cases, the result is that one can employ the full available bandwidth up to the Nyquist limit.

Figure 16:
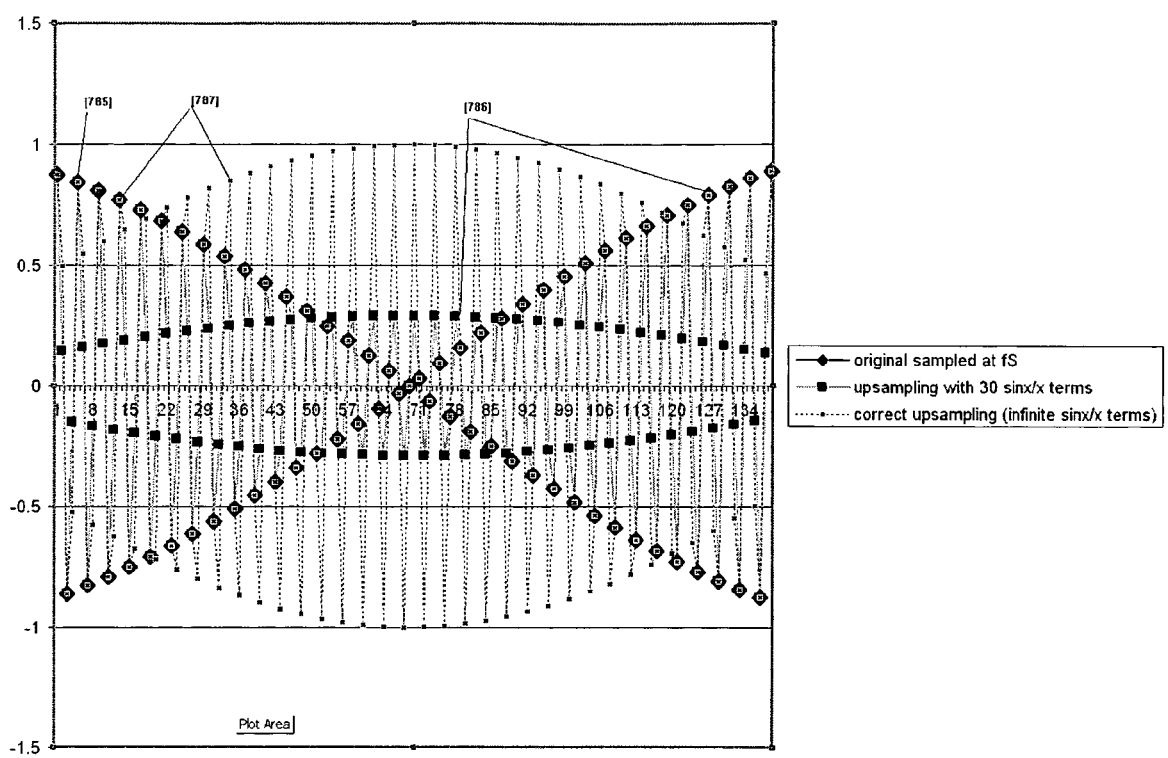
FIG. 16 depicts an example of data being upsampled using a truncated Sinc method resulting in a large artifact.

FIG. 16, as first noted above, illustrates artifacts created when a signal of a frequency near the Nyquist limit is Sinc-function interpolated with a finite upsample distance of 30. The original data is shown [785] (large diamonds) are shown as ordinates, with the time and samples being the abscissa. The interpolation [786] (small squares) creates artifacts commensurate with the original waveform [785] (large diamonds) when the frequency nears Nyquist (here, the frequency is 0.98 times Nyquist). The correct upsampling is indicated by the third curve [787] (small x's), that would only be achieved by a Sinc function interpolation/upsampling of infinite range; therefore, a non-adaptive upsampling strategy cannot use the full available bandwidth up to the Nyquist limit.

What is claimed is:

1. A method for acquiring an analog signal, comprising the steps of:
   acquiring a first portion of the analog signal by a first channel, the first portion of the analog signal spanning a first bandwidth range;
   acquiring a second portion of the analog signal by a second channel, the second portion of the analog signal spanning a second bandwidth range adjacent the first bandwidth range;
   offsetting at least one aliasing spur in the signal acquired by the first channel corresponding to a portion of the analog signal that should have properly been acquired by the second channel with an opposite spur in the second channel; and
   storing the signals acquired by the first and second channels after offsetting in a computer readable medium.

2. The method of claim 1, wherein the opposite spur in the second channel is generated as a consequence of the use of a finite response filter therein.

3. The method of claim 2, further comprising the step of adjusting a sampling delay associated with at least one of the first and second channels to maintain the first and second portions of the analog signal substantially in quadrature.

4. The method of claim 1, wherein the portions of the analog signal acquired by at least one of the first and second channels is determined in accordance with one or more digital filters.

5. The method of claim 1, further comprising the steps of:
   acquiring a third portion of the analog signal by a third channel, the third portion of the analog signal spanning a third bandwidth range;
   acquiring a fourth portion of the analog signal by a fourth channel, the fourth portion of the analog signal spanning a fourth bandwidth range adjacent the third bandwidth range;
   offsetting at least one aliasing spur in the signal acquired by the third channel corresponding to a portion of the analog signal that should have properly been acquired by the fourth channel with an opposite spur in the fourth channel; and
   offsetting at least one aliasing spur in a signal generated by the offsetting of the spurs in the first and second portions of the analog signal and at least one spur in a signal generated by the offsetting of the spurs in the third and fourth portions of the analog signal.

6. The method of claim 1, further comprising the steps of:
   acquiring $2^n$ portions of the analog signal by $2^n$ channels, each of the $2^n$ portions of the analog signal spanning different bandwidth ranges, corresponding to a first defined acquisition level, where "n" is a non-zero integer;
   combining pairs of the $2^n$ portions of the analog signal by offsetting at least one aliasing spur in the signal acquired by each odd numbered channel of the $2^n$ channels corresponding to a portion of the analog signal that should have properly been acquired by a corresponding adjacent even numbered channel of the $2^n$ channels with an opposite spur in the adjacent even numbered channel to generate $2^n/2$ second level signals;
   combining pairs of the $2^n/2$ second level signals by offsetting at least one aliasing spur in each second level signal with an opposite spur in an adjacent second level signal to generate $2^n/4$ third level signals;
   performing the combining and offsetting process n times to generate n levels of signals until a single signal is generated.

7. The method of claim 1, wherein the opposite spur in the second channel is generated by inverting every other sample of the acquired portion of the analog signal.

8. The method of claim 7, wherein the acquired portion of the analog signal is inverted by multiplying the values of the samples thereof by an inverting factor alternatively comprising 1 and −1.

9. The method of claim 1, further comprising the step of upsampling the acquired second portion of the analog signal.

10. The method of claim 1, further comprising the step of interpolating the acquired second portion of the analog signal.

11. The method of claim 1, further comprising the step of combining the signals acquired by the first and second channels by use of a summer.

12. A method for acquiring an analog signal, comprising the steps of:
   inverting by frequency inversion a first portion of the analog signal;
   acquiring the inverted first portion of the analog signal by a first channel in accordance with a first filter to generate a series of samples corresponding to the first portion of the analog signal, the first portion of the analog signal spanning a first bandwidth range;
   acquiring a second portion of the analog signal by a second channel in accordance with a second filter to generate a series of samples corresponding to the second portion of the analog signal, the second portion of the analog signal spanning a second bandwidth range adjacent the first bandwidth range;
   processing the samples corresponding to the first and second portions of the analog signal in accordance with predefined interpolation processing;
   inverting alternating samples of the first acquired portion;
   combining the processed samples corresponding to the first and second acquired portions; and
   storing the combined processed samples in a computer readable medium
   whereby at least one aliasing spur in the samples acquired corresponding to the first of the acquired portions corresponding to a portion of the analog signal that should have properly been acquired by the second channel is offset with an opposite spur in the samples acquired corresponding to the second of the acquired portions.

13. The method of claim 12, wherein the processing of the samples corresponding to each of the first and second acquired portions comprises adaptive interpolation employing a finite impulse response filter, the taps of each of the filters being measured in accordance with an impulse response of the channel other that used to generate the corresponding first and second acquired portions.

14. The method of claim 12, further comprising the step of processing the signals to eliminate crosstalk between the channels by subtracting twice a measured crosstalk amount from every other sample of the processed samples corresponding to the first acquired portion.

15. A signal acquisition apparatus for acquiring an analog signal, comprising:
a first signal acquisition channel for acquiring a first portion of the analog signal, the first portion of the analog signal spanning a first bandwidth range;
a second signal acquisition channel for acquiring a second portion of the analog signal, the second portion of the analog signal spanning a second bandwidth range adjacent the first bandwidth range; and
a summer for summing the two channels in a manner to offset at least one aliasing spur in the signal acquired by the first channel corresponding to a portion of the analog signal that should have properly been acquired by the second channel with an opposite spur in the second channel.

16. The apparatus of claim 15, wherein the opposite spur in the second channel is generated as a consequence of the use of a finite response filter therein.

17. The apparatus of claim 16, wherein sampling delays associated with the first and second portions of the analog signal are adjusted by a sampling controller to maintain the first and second portions of the analog signal substantially in quadrature.

18. The apparatus of claim 15, wherein the portions of the analog signal acquired by at least one of the first and second channels is determined in accordance one or more digital filters.

19. The apparatus of claim 15, further comprising:
a third acquisition channel for acquiring a third portion of the analog signal, the third portion of the analog signal spanning a third bandwidth range;
a fourth acquisition channel for acquiring a fourth portion of the analog signal, the fourth portion of the analog signal spanning a fourth bandwidth range adjacent the third bandwidth range;
a second summer for summing the third and fourth channels in a manner to offset at least one aliasing spur in the signal acquired by the third channel corresponding to a portion of the analog signal that should have properly been acquired by the fourth channel with an opposite spur in the fourth channel; and
a third summer for summing the resulting signals generated from the summing of the first and second channels and from the summing of the third and fourth channels to offset at least one aliasing spur in a signal generated by the offsetting of the spurs in the first and second portions of the analog signal and at least one spur in a signal generated by the offsetting of the spurs in the third and fourth portions of the analog signal.

20. The apparatus of claim 15, further comprising an inverter for inverting the every other sample of the acquired portion of the analog signal to generate the opposite spur in the second channel.

21. The apparatus of claim 20, wherein the acquired portion of the analog signal is inverted by multiplying the values thereof by an inverting factor alternatively comprising 1 and −1.

22. The apparatus of claim 20, wherein the portion of the analog signal to be acquired by the first channel is inverted by combination with an inverting analog signal.

23. There apparatus of claim 15, wherein the signal acquisition apparatus comprises a portion of an oscilloscope.

24. A method for calibrating input channels of a signal acquisition system, comprising the steps of:
applying an impulse signal to a first acquisition channel and to a second acquisition channel, the first acquisition channel comprising a frequency conversion apparatus;
determining an optimal impulse position with respect to a sampling clock to maximize a DC component output into the first channel of the signal acquisition system, the first channel acquiring signals spanning a bandwidth of from half the sampling frequency to the sampling frequency;
determining a sampling delay applicable to a signal acquired on the first channel so that corresponding filter taps employed in processing the signal acquired on the second channel do not cause a phase shift thereof in the vicinity of bandwidth at approximately half the sampling frequency;
determining a sampling delay applicable to a signal acquired on a second channel spanning a bandwidth of DC to one half the sampling frequency so that corresponding filter taps employed in processing the signal acquired on the first channel do not cause a phase shift thereof in the vicinity of bandwidth at approximately half the sampling frequency;
storing the determined sampling delays and filter taps for use during operation of the signal acquisition system.

25. A method for calibrating input channels of a signal acquisition system, comprising the steps of:
measuring a frequency and phase response in a substantially symmetric frequency interval about approximately half a sampling rate of a first channel;
measuring a frequency and phase response of a second channel in a substantially symmetric frequency interval about approximately half the sampling rate;
modifying a sampling delay of at least one of the channels to create quadrature between sinusoidal signals, each having a frequency that is approximately half the sampling rate, carried on the first and second channels;
dividing the measured frequency and phase response of the first channel by the measured frequency and phase response of the second channel to generate a ratio of responses at each of a plurality of frequencies;
transforming the ratios of responses via a fast Fourier transform techniques into a first series of filter taps defining a first digital filter to be used with signals sampled at twice the sampling rate by padding the ratios of responses with a constant value for frequencies less than half the sampling rate; and
transforming the ratios of responses via a fast Fourier transform techniques into a second series of filter taps defining a second digital filter to be used with signals sampled at twice the sampling rate by first inverting the ratios of responses, then shifting each of the ratios to a frequency equal to the difference between the sampling rate and the corresponding one of the plurality of frequencies, and then padding the ratios of responses with a constant value for frequencies less than half the sampling rate, wherein the first and second digital filters are used for the purpose of offsetting spurs resulting from aliasing.

26. The method of claim 25, further comprising the steps of:

measuring a frequency response observed on the first channel at an aliased frequency;

mirroring the frequency response measured at the aliased frequency about a frequency that is half the sampling rate; and adding the mirrored frequency response to the frequency and phase response of the first channel before the signal is used to generate the series of filter taps.

27. A method for transmitting a digital signal representative of a single analog signal over two transmission channels, each channel capable of transmitting half of the data associated with the digital signal, comprising the steps of:

inverting the sign of every other sample on a first of the two channels;

shifting the samples on the second channel by one sample;

applying first substantially identical low pass filters to the samples entering the first channel and to the samples exiting the second channel;

applying second substantially identical low pass filters to the samples exiting the first channel and to the samples exiting the second channel;

unshifting the samples on the second channel;

reinverting the previously inverted signs of the samples on the first channel;

summing the samples on the first and second channels to form a summed sample set substantially free of aliasing; and storing the summed sample set in a computer readable medium.

28. The method of claim 27, wherein the first substantially identical low pas filters are different from the second substantially identical low pass filters.

* * * * *

UNITED STATES PATENT AND TRADEMARK OFFICE
CERTIFICATE OF CORRECTION

PATENT NO.       : 7,304,597 B1
APPLICATION NO.  : 11/442030
DATED            : December 4, 2007
INVENTOR(S)      : Francois LaMarche It is certified that error appears in the above-identified patent and that said Letters Patent is hereby corrected as shown below:

<u>Column 6,</u>
Line 63, "rather that z" should read -- rather than z --

<u>Column 7,</u>
Line 46, "cross-talk correcting" should read -- crosstalk correcting --

<u>Column 8,</u>
Line 25, "with amplitudes ½ $m_{HF}$ and ½ $m_{LF}$* respectively." should read -- with amplitudes ½ $m_{LF}$ and -½ $m_{LF}$* respectively. --

Line 54, "for $\mathcal{A}$ to depend" should read -- for $\mathcal{A}_L$ to depend --

Line 55, "for $\mathcal{A}$ to depend" should read -- for $\mathcal{A}_H$ to depend --

Line 57, "to maintain $\mathcal{L}^*=\eta^*H$ and" should read -- to maintain $\mathcal{L}l=\eta^*H$ and --

Line 59, "η=1/sum" should read -- $\eta = l/$ sum --

<u>Column 9,</u>
Line 55, " $(½\mathcal{H}^*h - ½\lambda L^* + ½\mathcal{H}^*X^*)l_L^*$ and $(½\eta^*H - ½\mathcal{L}l^* + ½\Theta^*T^*)l_H^*$ " should read -- $(½\mathcal{H}^*h - ½\lambda L^* + ½\mathcal{H}^*X^*)l_L^*$ and $(½\eta^*H - ½\mathcal{L}l + ½\eta^*T^*)l_H^*$ --

<u>Column 11,</u>
Line 27, "each of its channel." should read -- each of its channels. --
Line 39, "timing of $d_{1F}$ by" should read -- timing of $d_{1F}$ by --
Line 40, "of $(d_{10}, d_{1F}, d_{1A})$ are" should read -- of $(d_{10}, d_{1F}, d_{1A})$ are --
Line 43, "be called $d_{1M}$" should read -- be called $d_{1M}$ --
Line 55, "variable $d_{1M}$" should read -- variable $d_{1M}$ --
Line 60, "the loop $d_{1F}$" should read -- the loop $d_{1F}$ --

<u>Column 12,</u>
Line 32, "exactly $f_S/2$ would" should read -- exactly $f_S/2$ would --
Line 43, "with $d_{1M}$" should read -- with $d_{1M}$ --
Line 45, "variable $d_H$ is set to $d_{H0}$" should read -- variable $d_H$ is set to $d_{H0}$ --
Line 47, "$d_{H0}$ represents" should read -- $d_{H0}$ represents --
Line 62, "variable $d_H$ controlling" should read -- variable $d_H$ controlling --
Line 64, "variable $d_H$ is" should read -- variable $d_H$ is --

UNITED STATES PATENT AND TRADEMARK OFFICE
CERTIFICATE OF CORRECTION

PATENT NO. : 7,304,597 B1
APPLICATION NO. : 11/442030
DATED : December 4, 2007
INVENTOR(S) : Francois LaMarche It is certified that error appears in the above-identified patent and that said Letters Patent is hereby corrected as shown below:

Column 13,
Line 1, "with $s_F$. The $s_F$ calibration" should read -- with $s_F$. The $s_F$ calibration --
Line 3, "than $s_F$, calibration" should read -- than $s_F$, calibration --
Line 4, "of $d_H$ is" should read -- of $d_H$ is --
Line 8, "of $d_H$ is" should read -- of $d_H$ is --
Line 46, "of $d_H$ performed" should read -- of $d_H$ performed --
Line 53, "$d_H$ is reduced" should read -- $d_H$ is reduced --
Line 56, "value of $d_H$." should read -- value of $d_H$. --

Column 14,
Line 24, "with $d_{1M}$," should read -- with $d_{1M}$, --
Line 26, "variable $d_L$ is set to $d_{L0}$ plus" should read -- variable $d_L$ is set to $d_{L0}$ plus --
Line 28, "parameter $d_{L0}$ represents" should read -- parameter $d_{L0}$ represents --
Line 42, "variable $d_L$ controlling" should read -- variable $d_L$ controlling --
Line 44, "variable $d_L$ is" should read -- variable $d_L$ is --
Line 48, "with $s_F$. The $s_F$ calibration" should read -- with $s_F$. The $s_F$ calibration --
Line 51, "than $s_F$, calibration" should read -- than $s_F$, calibration --
Line 52, "of $d_L$ is" should read -- of $d_L$ is --
Line 56, "value of $d_L$ is" should read -- value of $d_L$ is --

Column 15,
Line 12, "of $d_L$, performed" should read -- of $d_L$, performed --
Line 19, "450, $d_L$ is" should read -- 450, $d_L$ is --
Line 23, "$d_L$. The" should read -- $d_L$. The --
Line 49, "where $d_L$ is" should read -- where $d_L$ is --
Line 51, "3$d$), and" should read -- 3d), and --
Line 54, "frequency $f_S/2$, when" should read -- frequency $f_S/2$, when --

Column 17,
Line 56, "output of a HF" should read -- output of an HF --

Column 18,
Line 36, "such as signal" should read -- such a signal --
Line 52, "bandwidth 1" should read -- bandwidth 11 --
Line 63, "1/2$f_S$, putting it a quarter of cycle of $f_S/2$ ahead" should read -- 1/2$f_S$, putting it a quarter of cycle of $f_S/2$ ahead --

UNITED STATES PATENT AND TRADEMARK OFFICE
CERTIFICATE OF CORRECTION

PATENT NO. : 7,304,597 B1
APPLICATION NO. : 11/442030
DATED : December 4, 2007
INVENTOR(S) : Francois LaMarche It is certified that error appears in the above-identified patent and that said Letters Patent is hereby corrected as shown below:

Column 20,
Line 1, "(or $f_S$ in general)" should read -- (or $f_S$ in general) --
Line 22, "enters a LF" should read -- enters an LF --
Line 27, "a HF adaptive" should read -- an HF adaptive --
Line 31, "frequency $f_S$ sampled at 2 $f_S$, namely" should read -- frequency $f_S$ sampled at 2 $f_S$, namely --
Line 36, "described the" should read -- described in the --
Line 63, "the DC-S GHz" should read -- the DC-5 GHz --

Column 21,
Line 40, "together $2^N$ channels" should read -- together $2^N$ channels --

Column 22,
Line 42, "all $2^N$-1" should read -- all $2^N$-1 --
Line 43, "of $2^N$ bands" should read -- of $2^N$ bands --
Line 44, "where 0 <= k <= $2^N$-1 is" should read -- where 0 <= k <= $2^N$-1 is --
Line 45, "time j / ($2^N$ $f_S$)" should read -- time j / ($2^N$ $f_S$) --
Line 47, "floor((k+1)/2) $f_S$ is" should read -- floor((k+1)/2) $f_S$ is --
Line 58, "either $d_H$ or $d_L$ have" should read -- either $d_H$ or $d_L$ have --

Column 23,
Line 4, "frequency $f_S/2$ and" should read -- frequency $f_S/2$ and --
Line 7, "setting $d_H$ and $d_L$ to" should read -- setting $d_H$ and $d_L$ to --
Line 13, ")/($2\pi(f_S/2)$) is added to $d_H$. At" should read -- )/($2\pi(f_S/2)$) is added to $d_H$. At --
Line 18, "frequency $f_{IN}$ to" should read -- frequency $f_{IN}$ to --
Line 19, "plus $f_S/2$, where" should read -- plus $f_S/2$, where --
Line 22, "(either at $f_{IN}$ or $f_S/2f_{IN}$)" should read -- (either at $f_{IN}$ or $f_S/2-f_{IN}$) --
Line 22, "and HF channel are measured," should read -- and HF channel, --
Line 42, "where arrays IPH$_{FD}$ and IPL$_{FD}$ are" should read -- where arrays IPH$_{FD}$ and IPL$_{FD}$ are --
Line 44, "execution proceed" should read -- execution proceeds --
Line 46, "arrays IPH$_{FD}$ and IPL$_{FD}$ are" should read -- arrays IPH$_{FD}$ and IPL$_{FD}$ are --
Line 48, "1227, IPH$_{FD}$ is" should read -- 1227, IPH$_{FD}$ is --
Line 50, "IPH$_{FD}$ is" should read -- IPH$_{FD}$ is --
Line 57, "of IPH$_{FD}$ and IPL$_{FD}$ from" should read -- of IPH$_{FD}$ and IPL$_{FD}$ from --
Line 59, "where IPH$_{FD}$ and IPL$_{FD}$ are" should read -- where IPH$_{FD}$ and IPL$_{FD}$ are --
Line 61, "IPH, $d_H$ and $d_L$ is" should read -- IPH, $d_H$ and $d_L$ is --

UNITED STATES PATENT AND TRADEMARK OFFICE
CERTIFICATE OF CORRECTION

PATENT NO. : 7,304,597 B1
APPLICATION NO. : 11/442030
DATED : December 4, 2007
INVENTOR(S) : Francois LaMarche It is certified that error appears in the above-identified patent and that said Letters Patent is hereby corrected as shown below:

Column 24,
Line 4, "here it is represented it" should read -- here it is represented --
Line 16, "from $f_S/2$, the" should read -- from $f_S/2$, the --
Line 29, "this cross-talk contribution," should read -- this crosstalk contribution, --
Line 33, "the cross-talk during" should read -- the crosstalk during --
Line 36, "for $IPH_{FD}$ from" should read -- for $IPH_{FD}$ from --
Line 49, "and $IPL_{FD}$ from" should read -- and $IPL_{FD}$ from --

IN THE CLAIMS:

Column 26,
Line 2 (Claim 6), "acquiring $2^n$ portions of the analog signal by $2^n$ channels" should read -- acquiring $2^n$ portions of the analog signal by $2^n$ channels --
Line 3 (Claim 6), "the $2^n$ portions" should read -- the $2^n$ portions --
Line 7 (Claim 6), "the $2^n$ portions" should read -- of the $2^n$ portions of --
Line 9 (Claim 6), "of the $2^n$" should read -- of the $2^n$ --
Line 13 (Claim 6), "$2^n$ channels with" should read -- $2^n$ channels with --
Line 14 (Claim 6), "generate $2^n/2$ second" should read -- generate $2^n/2$ second --
Line 16 (Claim 6), "of the $2^n/2$ second" should read -- of the $2^n/2$ second --
Line 19 (Claim 6), "generate $2^n/4$ third" should read -- generate $2^n/4$ third --

Column 27,
Line 6 (Claim 13), "other that used" should read -- other than that used --
Line 39 (Claim 18), "in accordance one" should read -- in accordance with one --

UNITED STATES PATENT AND TRADEMARK OFFICE
CERTIFICATE OF CORRECTION

PATENT NO. : 7,304,597 B1
APPLICATION NO. : 11/442030
DATED : December 4, 2007
INVENTOR(S) : Francois LaMarche It is certified that error appears in the above-identified patent and that said Letters Patent is hereby corrected as shown below:

Column 28,
Line 8 (Claim 23), "There apparatus of" should read -- The apparatus of --
Line 53 (Claim 25), "transform techniques into" should read -- transform technique into --
Line 59 (Claim 25), "transform techniques into" should read -- transform technique into --

Signed and Sealed this

Seventeenth Day of February, 2009

JOHN DOLL
*Acting Director of the United States Patent and Trademark Office*